(12) United States Patent
Kibune

(10) Patent No.: US 7,598,780 B2
(45) Date of Patent: Oct. 6, 2009

(54) CLOCK BUFFER

(75) Inventor: Masaya Kibune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/882,562

(22) Filed: Aug. 2, 2007

(65) Prior Publication Data

US 2007/0273413 A1    Nov. 29, 2007

Related U.S. Application Data

(63) Continuation of application No. PCT/JP2005/001695, filed on Feb. 4, 2005.

(51) Int. Cl.
*H03B 1/00* (2006.01)
(52) U.S. Cl. .................. 327/108; 327/109; 327/112; 326/86
(58) Field of Classification Search .............. None
See application file for complete search history.

(56) References Cited

U.S. PATENT DOCUMENTS

| 5,185,538 | A  | * | 2/1993  | Kondoh et al. ............. 327/109 |
| 5,572,146 | A  | * | 11/1996 | Ahn et al. ................... 326/27 |
| 6,259,282 | B1 | * | 7/2001  | Morris ........................ 327/112 |
| 2003/0216907 | A1 | * | 11/2003 | Thomas ................. 704/200.1 |

FOREIGN PATENT DOCUMENTS

| JP | 3-109428 U1 | 11/1991 |
| JP | 4-76725 U1 | 7/1992 |
| JP | 05-122625 A | 5/1993 |

* cited by examiner

*Primary Examiner*—An T Luu
(74) *Attorney, Agent, or Firm*—Fujitsu Patent Center

(57) ABSTRACT

A clock buffer has a band-pass frequency characteristic, in which a pass band of the buffer includes a fundamental frequency of a clock and a gain for attenuating signals, that is, a gain of less than 0 dB is provided at frequencies below the pass band.

13 Claims, 28 Drawing Sheets

CLOCK BUFFER

This application is a continuing application, filed under 35 U.S.C. §111(a), of International Application PCT/JP2005/001695, filed Feb. 4, 2005.

BACKGROUND OF THE INVENTION

1. Field

The present embodiment relates to a clock buffer, and particularly to a clock buffer for waveform-shaping a clock.

2. Description of the Related Art

Recently, the speed of signal transmission between circuit blocks in chips, between LSI (Large Scale Integration) chips, between circuit boards or between chassis is more and more increased. Accompanying this tendency, the performance of components constituting computers and information processing apparatuses has been greatly improved. For example, improvements in the performance of SRAMs (Static Random Access Memories), DRAMs (Dynamic Random Access Memories), processors and switching LSIs have been made. As a result, there causes a problem that system performance cannot be further improved unless the speed of signal transmission between components or elements is increased.

Specifically, the speed gap between memories such as SRAMs and DRAMs and processors tends to widen, and this speed gap is recently becoming a hindrance to the performance improvement of computers. Further, with the increase in size of chips, not only the speed of signal transmission between these chips but also the speed of signal transmission between elements or circuit blocks in chips has become a major factor limiting the performance of chips. Moreover, the speed of signal transmission between peripheral devices and the processor/chipset has also become a factor limiting the performance of the whole system.

In speeding up the signal transmission between circuit blocks, between chips or between chassis, it is essential to propagate a high-speed clock to the circuit block without deteriorating clock quality (skew, jitter amount). The reason is that the timing accuracy of the propagated clock affects the accuracy of receive timing and also the timing accuracy of a signal to be generated.

For clock transmission in LSIs, an unbalanced clock buffer using an inverter or a balanced clock buffer based on differential CML (Current Mode Logic) is conventionally used.

FIG. 26 is a circuit diagram of the unbalanced clock buffer using an inverter. The clock buffer shown in FIG. 26 comprises an inverter composed of a PMOS transistor M101 and an NMOS transistor M102.

FIG. 27 is a circuit diagram of a balanced clock buffer based on differential CML. The clock buffer shown in FIG. 27 comprises NMOS transistors M111 and M112 forming a differential input, a transistor M113 for causing a bias current to flow through the transistors M111 and M112, and resistors R101 and R102.

Each of the clock buffers shown in FIGS. 26 and 27 has a low-pass frequency characteristic, in which a cutoff frequency of the clock buffer is higher than a fundamental frequency of a clock to be transmitted and a gain at frequencies sufficiently below the fundamental frequency of the clock is 0 dB or more. This is for preventing that a waveform of the clock is attenuated so as not to be propagated.

FIG. 28 shows frequency characteristics of a conventional clock buffer. As shown in FIG. 28, the conventional clock buffer has a low-pass filter characteristic which passes signals below the cutoff frequency fc. The clock buffer is designed such that its cutoff frequency is higher than the fundamental frequency of a clock to be transmitted and a gain at low frequencies is 0 dB or more to prevent a voltage waveform of the clock from disappearing.

There is disclosed a solid-state image sensor drive circuit having simple circuitry which reduces power consumption of transfer type solid-state image sensor such as a CCD (Charged Coupled Device) and which enables a modulation of a transfer clock also at low frequencies (see, e.g., Japanese Unexamined Patent Application Publication No. 5-122625).

However, the conventional clock buffer has the following problems. First, since the gain at frequencies sufficiently below the fundamental frequency of a clock is 0 dB or more, when noise at frequencies below the fundamental frequency of the clock is added, the noise is amplified and the jitter is increased.

Further, when variations occur in elements constituting a clock buffer, for example, when differences occur between threshold voltages of differential input transistors, since the gain at low frequencies is 0 dB or more, an error voltage (offset voltage) produced by converting a threshold voltage difference to an input voltage difference is amplified and output as a differential output. Specifically, when a clock superimposed with a DC component passes through multiple stages of clock buffers, the DC component is amplified and as a result, the clock disappears.

SUMMARY

The present embodiment provides a clock buffer waveform-shaping a clock including a band-pass frequency characteristic which has a pass band which includes a fundamental frequency of the clock and a gain attenuating signals is provided at frequencies below the pass band.

DETAILED DESCRIPTION OF THE PREFERRED EMBODIMENTS

The conventional clock buffer has the following problems. First, since the gain at frequencies sufficiently below the fundamental frequency of a clock is 0 dB or more, when noise at frequencies below the fundamental frequency of the clock is added, the noise is amplified and the jitter is increased.

Further, when variations occur in elements constituting a clock buffer, for example, when differences occur between threshold voltages of differential input transistors, since the gain at low frequencies is 0 dB or more, an error voltage (offset voltage) produced by converting a threshold voltage difference to an input voltage difference is amplified and output as a differential output. Specifically, when a clock superimposed with a DC component passes through multiple stages of clock buffers, the DC component is amplified and as a result, the clock disappears.

In view of the foregoing, it is a proposition of embodiments to provide a clock buffer in which noise at frequencies below the fundamental frequency of a clock is reduced so that jitter can be reduced and at the same time, a DC component included in the clock is suppressed so that disappearance of the clock can be prevented.

Figure 1:
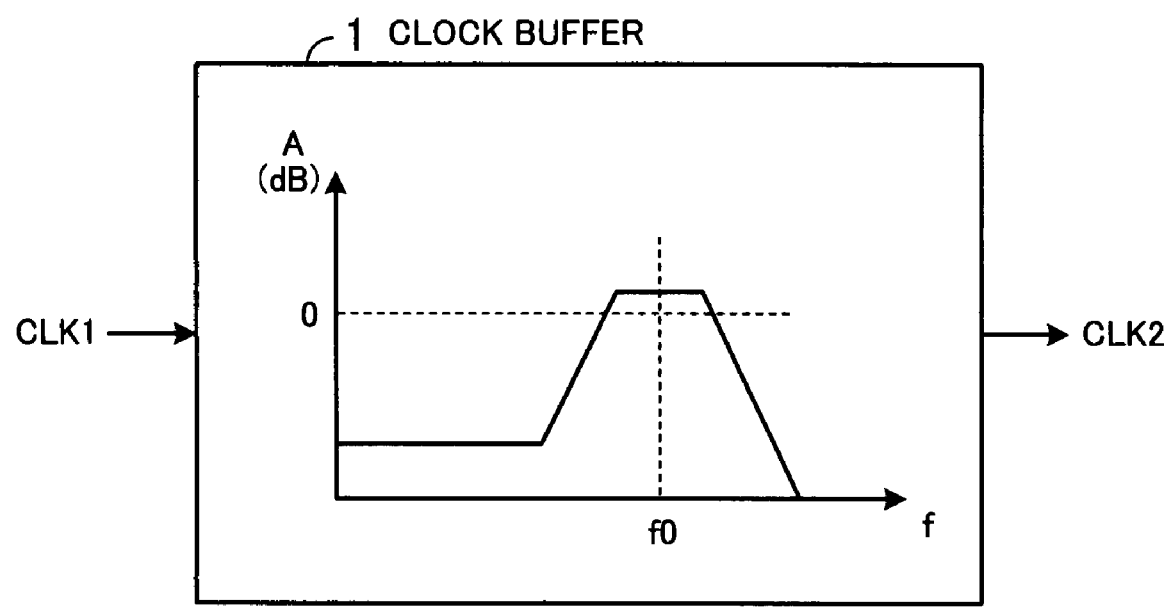
FIG. 1 shows an outline of a clock buffer.

To accomplish the above object, according to the embodiment, there is provided a clock buffer 1 for waveform-shaping a clock CLK 1 as shown in FIG. 1, the clock buffer 1 having a band-pass frequency characteristic, wherein a pass band of the clock buffer 1 includes a fundamental frequency f0 of the clock CLK 1 and a gain for attenuating signals is provided at frequencies below the pass band.

According to the clock buffer 1, a pass band of the clock buffer 1 includes a fundamental frequency f0 of the clock CLK 1 and a gain for attenuating signals is provided at frequencies below the pass band. Therefore, noise at frequencies below the fundamental frequency f0 of the clock CLK 1 is reduced. At the same time, a DC component included in the clock CLK 1 is suppressed.

The clock buffer of the embodiment is designed such that a pass band of the clock buffer includes the fundamental frequency f0 of the clock and a gain for attenuating signals is provided at frequencies below the pass band. Therefore, noise at frequencies below the fundamental frequency f0 of the clock is reduced, so that jitter can be reduced. At the same time, a DC component included in the clock is suppressed, so that disappearance of the clock can be prevented.

The above and other propositions, features and advantages of the embodiment will become apparent from the following description when taken in conjunction with the accompanying drawings which illustrate preferred embodiments by way of example.

A principle of the embodiments will be described in detail below with reference to the accompanying drawings, wherein like reference numerals refer to like elements throughout.

FIG. 1 shows an outline of a clock buffer. As shown in FIG. 1, when a clock CLK1 is input, a clock buffer 1 waveform-shapes the clock CLK 1 and outputs the resulting clock CLK2.

The clock buffer 1 has a band-pass frequency characteristic as shown in FIG. 1, in which a pass band of the buffer 1 includes a fundamental frequency f0 of the clock CLK1 and a gain for attenuating signals, namely, a gain of less than 0 dB is provided at frequencies below the pass band. The clock CLK1 may be attenuated, for example, passing through a clock line and therefore, the gain in the pass band may be more than 0 dB.

As a result, the clock buffer 1 can output the clock CLK2 reduced in noise at frequencies below the fundamental frequency f0 of the clock CLK1. Further, the clock buffer 1 can output the clock CLK2 suppressed in a DC component (offset voltage) included in the clock CLK1.

Thus, the clock buffer 1 is designed such that a pass band of the clock buffer includes the fundamental frequency f0 of the clock and a gain for attenuating signals is provided at frequencies below the pass band. As a result, noise at frequencies below the fundamental frequency f0 of the clock is reduced, so that jitter can be reduced. Further, a DC component included in the clock is suppressed, so that disappearance of the clock can be prevented.

Next, one embodiment will be described in detail with reference to the accompanying drawings. In the embodiment, a waveform of an input clock and that of an ideal clock are compared and frequency characteristics are changed (waveform-shaping is performed) such that a waveform of the clock approximates that of the ideal clock, thereby reducing jitter and appropriately preventing disappearance of the clock.

Figure 2:
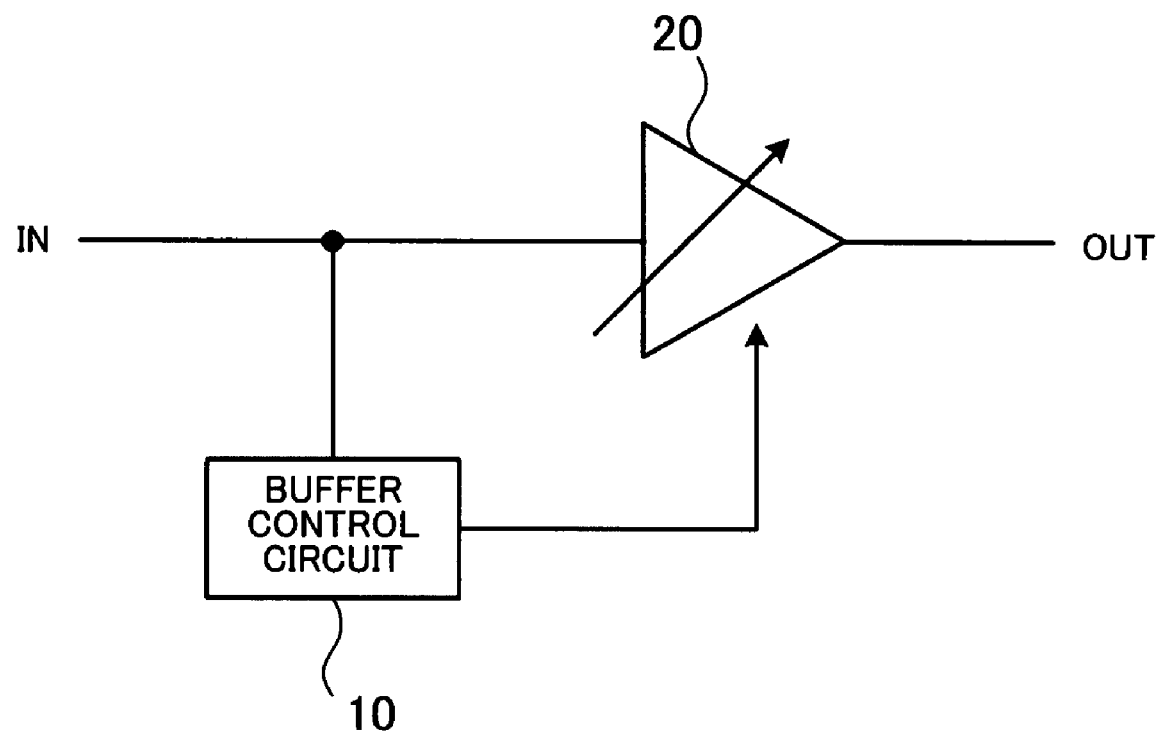
FIG. 2 is a block diagram of a clock buffer according to one embodiment.

FIG. 2 is a block diagram of the clock buffer according to the embodiment. As shown in FIG. 2, the clock buffer comprises a buffer control circuit 10 and a buffer 20. The clock buffer, when a clock supplied to a predetermined circuit block is input from an input terminal IN, waveform-shapes the clock and outputs the resulting clock to an output terminal OUT. When the clock passes through a clock line or a predetermined circuit, the amplitude of the clock may be attenuated and accordingly, the clock buffer is generally designed to have a predetermined gain.

The buffer control circuit 10 acquires waveform information of a clock (hereinafter, referred to as an actual clock) input to the input terminal IN. The buffer control circuit 10 internally generates an ideal clock and compares a waveform of the ideal clock and that of the actual clock. Then, the circuit 10 adjusts the frequency characteristics of the buffer 20 such that a waveform of the actual clock approximates that of the ideal clock.

According to a signal output from the buffer control circuit 10, the buffer 20 waveform-shapes the actual clock and outputs the resulting clock to the output terminal OUT. Specifically, by control of the buffer control circuit 10, the buffer 20 changes the frequency characteristics such that a waveform of the input actual clock approximates that of the ideal clock, and outputs the resulting clock to the output terminal OUT.

Thus, in the clock buffer, waveform-shaping is performed such that a waveform of the input actual clock approximates that of the ideal clock. Further, noise at frequencies below the fundamental frequency of the clock is reduced to thereby reduce jitter, and at the same time, a DC component included in the clock is suppressed to thereby prevent disappearance of the clock.

Next, a detailed block diagram of the buffer control circuit 10 will be described.

Figure 3:
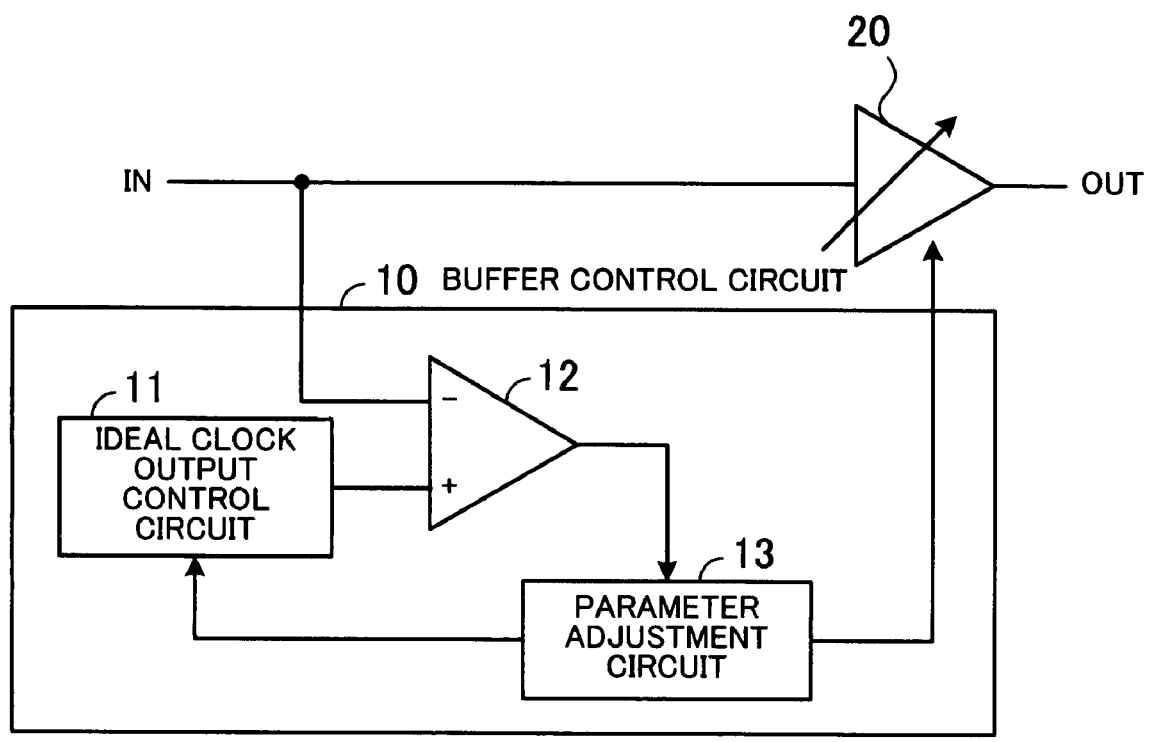
FIG. 3 is a detailed block diagram of the clock buffer in FIG. 2.

FIG. 3 is a detailed block diagram of the clock buffer in FIG. 2. As shown in FIG. 3, the buffer control circuit 10 has an ideal clock output control circuit 11, an amplifier 12 and a parameter adjustment circuit 13. In FIG. 3, the same elements as those shown in FIG. 2 are indicated by the same reference numerals as in FIG. 2 and the description is omitted.

The ideal clock output control circuit 11 internally generates an ideal clock and outputs the ideal clock to the amplifier 12. At this time, the circuit 11 changes (sweeps) a frequency of the generated ideal clock to coincide with a frequency of the actual clock. Then, the circuit 11 fixes a frequency of the ideal clock at the frequency coinciding with that of the actual clock. Subsequently, the circuit 11 changes a phase of the ideal clock to coincide with a phase of the actual clock. Control of the frequency and phase of the ideal clock is performed by the after-mentioned parameter adjustment circuit 13. Also determination whether the frequencies and phases of the ideal clock and the actual clock coincide with each other is performed by the parameter adjustment circuit 13.

The waveform of the ideal clock to be generated is selected according to the waveform of the actual clock. For example, if the waveform of the actual clock is a square wave, the ideal clock with a square wave is generated, if the waveform of the actual clock is a sine wave, the ideal clock with a sine wave is generated, and if the waveform of the actual clock is a triangular wave, the ideal clock with a triangular wave is generated. Thus, the actual clocks with various waveforms can be waveform-shaped.

The amplifier 12 is an amplifier for outputting as an output signal the intensity of an input signal, for example, an amplifier for passing a current proportional to the square of an input voltage difference. To the amplifier 12, the actual clock and the ideal clock output from the ideal clock output control circuit 11 are input. The amplifier 12 outputs to the parameter adjustment circuit 13 a current proportional to the square of a voltage difference between the actual clock and the ideal clock. In other words, as a waveform of the actual clock and that of the ideal clock are more similar to each other, the amplifier 12 outputs a smaller current to the parameter adjustment circuit 13. On the other hand, as a waveform of the actual clock and that of the ideal clock are more dissimilar to each other, the amplifier 12 outputs a larger current to the parameter adjustment circuit 13.

The parameter adjustment circuit 13 controls, according to the current output from the amplifier 12, a frequency of the ideal clock output by the ideal clock output control circuit 11. Specifically, the circuit 13 changes the frequency of the ideal clock output by the ideal clock output control circuit 11. When the current amount output from the amplifier 12 is minimized, that is, when the frequency of the actual clock and that of the ideal clock coincide with each other, the circuit 13 fixes the frequency of the ideal clock. Subsequently, the parameter adjustment circuit 13 changes the phase of the ideal clock output by the ideal clock output control circuit 11. When the current amount output from the amplifier 12, that is, when the phase of the actual clock and that of the ideal clock coincide with each other, the circuit 13 fixes the phase of the ideal clock.

Further, the parameter adjustment circuit 13, when the frequencies and phases of the ideal clock and the actual clock coincide with each other, controls the frequency characteristics of the buffer 20 according to the current amount output from the amplifier 12. Specifically, based on the current output from the amplifier 12, the circuit 13 controls the buffer 20 such that a waveform of the actual clock input to the buffer 20 approximates that of the ideal clock. The buffer 20 changes the frequency characteristics by control of the circuit 13 to waveform-shape the actual clock and output the resulting clock to the output terminal OUT.

As described above, the parameter adjustment circuit 13 adjusts the frequency and phase of the ideal clock to coincide with those of the actual clock. Accordingly, the actual clock input to the input terminal IN need not have a known fixed frequency. Even if the actual clocks have various frequencies such as 500 MHz, 1 GHz and 2 GHz, the buffer 20 can waveform-shape the actual clock.

Next, the current amount output from the amplifier 12 in FIG. 3 will be described.

Figure 4:
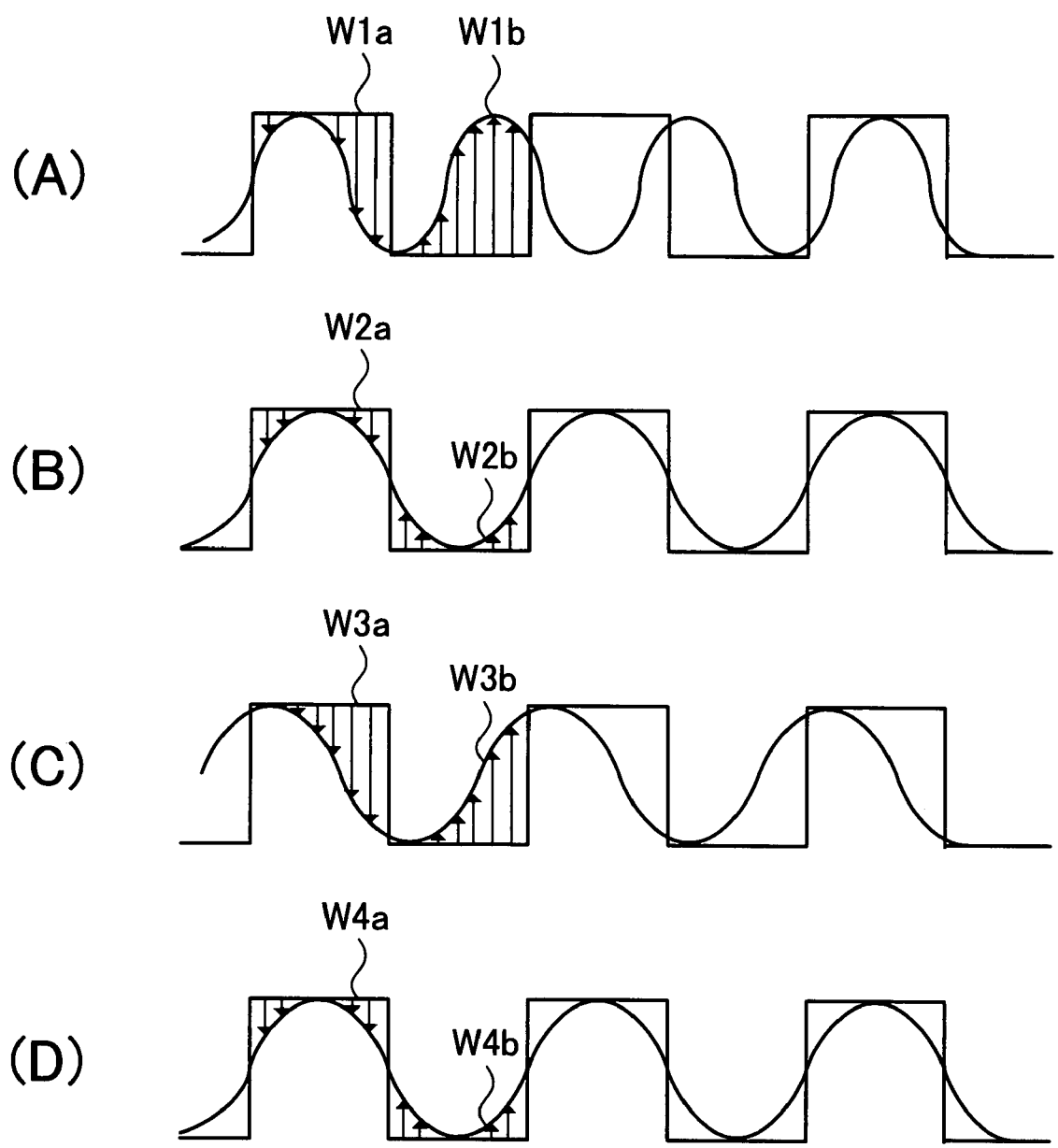
FIG. 4 shows waveforms of a clock input to an amplifier and that of an ideal clock.

FIG. 4 shows waveforms of the actual clock and that of the ideal clock input to the amplifier 12. In FIG. 4, waveforms W1a to W4a show waveforms of the ideal clocks and waveforms W1b to W4b show waveforms of the actual clocks.

FIG. 4 (A) shows the waveforms W1a and W1b in the case where the frequency of the ideal clock and that of the actual clock are different from each other. FIG. 4 (B) shows the waveforms W2a and W2b in the case where the frequencies of the waveforms W1a and W1b in FIG. 4 (A) are made to coincide with each other. FIG. 4 (C) shows the waveforms W3a and W3b in the case where the frequency of the ideal clock and that of the actual clock coincide with each other but the phase of the ideal clock and that of the actual clock are different from each other. FIG. 4 (D) shows the waveforms W4a and W4b in the case where the phases of the waveforms W3a and W3b in FIG. 4 (C) are made to coincide with each other.

When the frequency of the ideal clock and that of the actual clock are different from each other, a voltage difference between the ideal clock and the actual clock is large as indicated by an arrow in FIG. 4 (A). On the other hand, when the ideal clock output control circuit 11 changes the frequency of the ideal clock to coincide with the frequency of the actual clock, a voltage difference between the ideal clock and the actual clock is reduced as indicated by an arrow in FIG. 4 (B). Thus, the parameter adjustment circuit 13 can determine that when the current amount output from the amplifier 12 is minimized, both frequencies coincide with each other.

When the phase of the ideal clock and that of the actual clock are different from each other, a voltage difference between the ideal clock and the actual clock is large as indicated by an arrow in FIG. 4 (C). On the other hand, when the ideal clock output control circuit 11 changes the phase of the ideal clock to coincide with the phase of the actual clock, a voltage difference between the ideal clock and the actual clock is reduced as indicated by an arrow in FIG. 4 (D). Thus, the parameter adjustment circuit 13 can determine that when the current amount output from the amplifier 12 is minimized, both phases coincide with each other.

Thus, when the frequencies and phases of the ideal clock and the actual clock coincide with each other, the parameter adjustment circuit 13 controls the buffer 20 based on the current amount output from the amplifier 12 such that a waveform of the actual clock approximates that of the ideal clock.

For example, the circuit 13 can recognize that when the current amount output from the amplifier 12 is large, a waveform of the ideal clock and that of the actual clock are largely different from each other. Accordingly, the circuit 13 controls the buffer 20 such that a waveform of the actual clock approximates that of the ideal clock.

Next, a method of determining the frequency and phase of the ideal clock will be described.

Figure 5A:
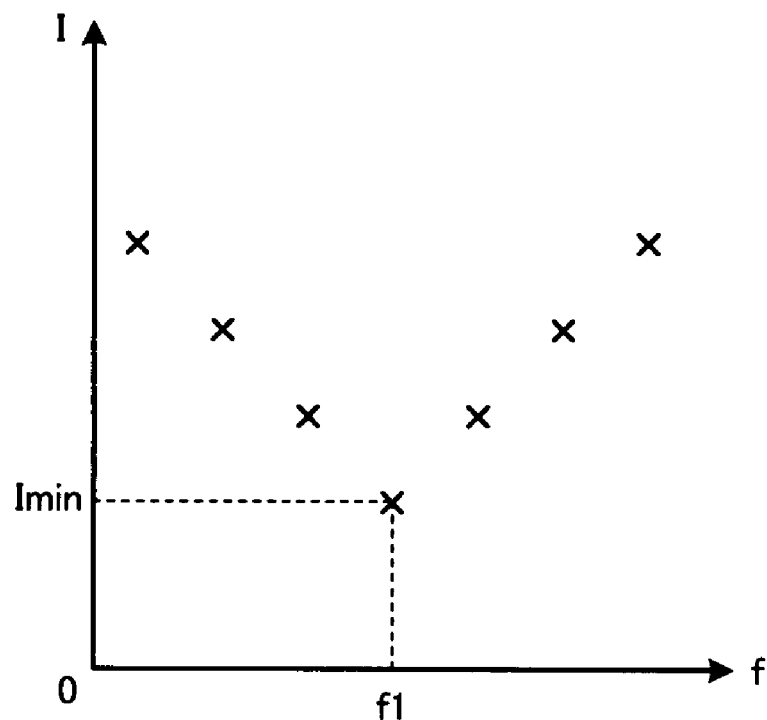
FIGS. 5A and 5B illustrate determination of a frequency and phase of the ideal clock.
Figure 5B:
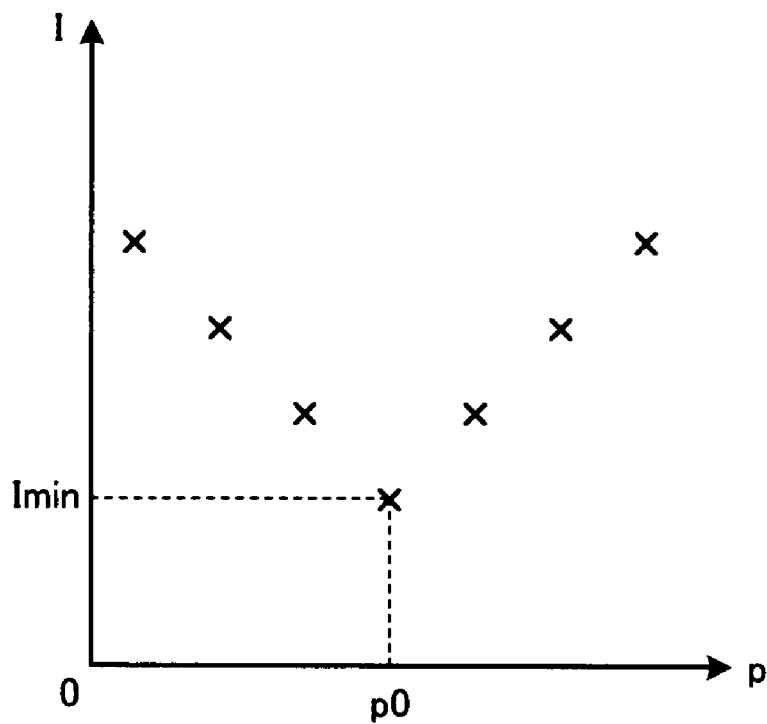

FIGS. 5A and 5B illustrate determination of the frequency and phase of the ideal clock. FIG. 5A illustrates determination of the frequency of the ideal clock, and FIG. 5B illustrates determination of the phase of the ideal clock.

In FIG. 5A, the horizontal axis represents the frequency of the ideal clock, and the vertical axis represents the current amount output from the amplifier 12. In FIG. 5B, the horizontal axis represents the phase of the ideal clock, and the vertical axis represents the current amount output from the amplifier 12.

When the ideal clock output control circuit 11 changes a frequency of the ideal clock and outputs the resulting ideal clock to the amplifier 12, there exists a frequency f1 at which the current value output from the amplifier 12 becomes a minimum Imin as shown in FIG. 5A. The frequency f1 at which the current value becomes the minimum Imin is a frequency coinciding with that of the actual clock. That is, the circuit 11 changes a frequency of the ideal clock as well as monitors a current value output from the amplifier 12. Thus, the circuit 11 can determine as the frequency of the ideal clock the frequency f1 at which the current value becomes the minimum Imin.

Likewise, when the ideal clock output control circuit 11 changes a phase of the ideal clock and outputs the resulting ideal clock to the amplifier 12, there exists a phase p0 at which the current value output from the amplifier 12 becomes a minimum Imin as shown in FIG. 5B. The phase p0 at which the current value becomes the minimum Imin is a phase coinciding with that of the actual clock. That is, the circuit 11 changes a phase of the ideal clock as well as monitors a current value output from the amplifier 12. Thus, the circuit 11 can determine, as the phase of the ideal clock, the phase p0 at which the current value becomes the minimum value Imin.

Next, the buffer 20 in FIG. 3 will be described in detail.

Figure 6:
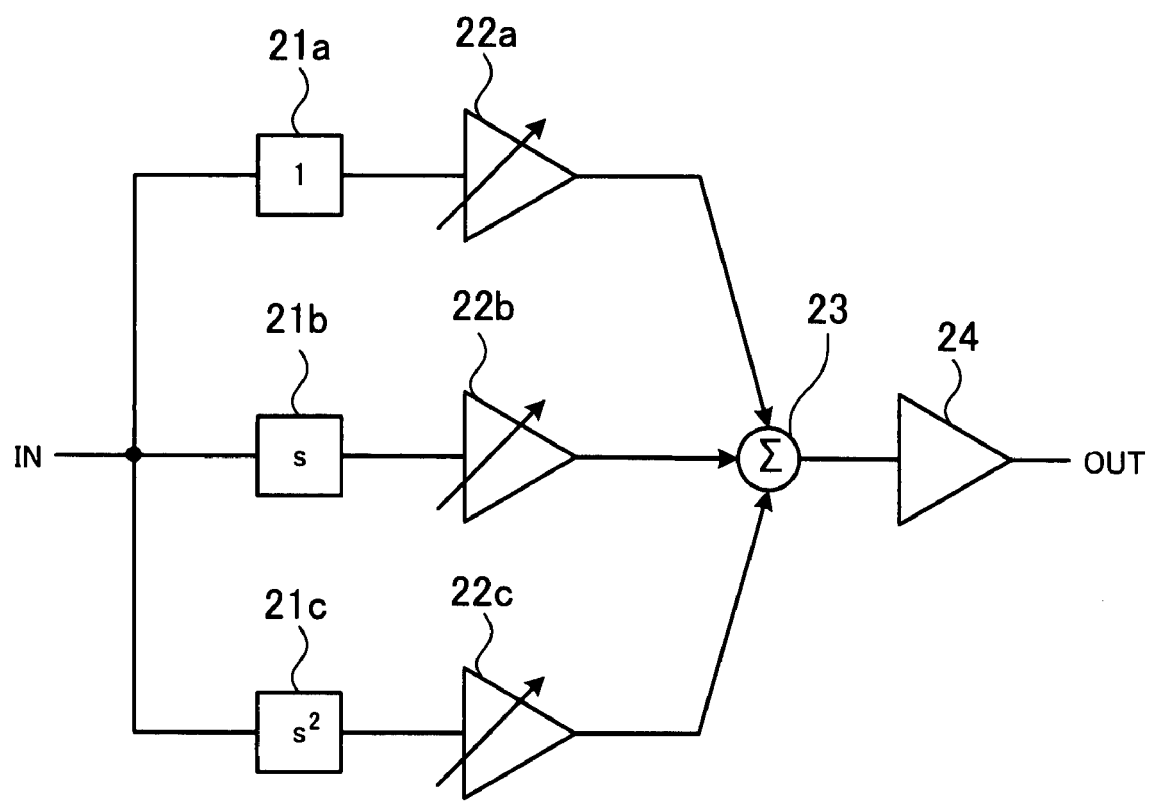
FIG. 6 is a circuit diagram of the buffer in FIG. 3.

FIG. 6 is a circuit diagram of the buffer 20 in FIG. 3. As shown in FIG. 6, the buffer 20 has a flat-band amplifier (reference number 1 in the figure) 21a, a primary differentiator (reference number s in the figure) 21b, a secondary differentiator (reference number s2 in the figure) 21c, variable gain amplifiers 22a to 22c, a mixer 23 and an amplifier 24.

The flat-band amplifier 21a has a transfer function with a pole. The primary differentiator 21b has a transfer function with a pole and a zero point. The secondary differentiator 21c is a secondary differentiator including the primary differentiators 21b connected in two stages. To the flat-band amplifier 21a, the primary differentiator 21b and the secondary differentiator 21c, the actual clocks are input in parallel from the input terminal IN.

Each of the variable gain amplifiers 22a to 22c is a variable gain amplifier which varies a gain by control of the parameter adjustment circuit 13. The variable gain amplifier 22a amplifies, by control of the parameter adjustment circuit 13, the actual clock output from the flat-band amplifier 21a. The variable gain amplifier 22b amplifies, by control of the parameter adjustment circuit 13, the actual clock output from the primary differentiator 21b. The variable gain amplifier 22c amplifies, by control of the parameter adjustment circuit 13, the actual clock output from the secondary differentiator 21c.

The mixer 23 adds the respective actual clocks output from the variable gain amplifiers 22a to 22c. The amplifier 24 amplifies the added actual clock by predetermined times and outputs the amplified clock to the output terminal OUT. That is, in the buffer 20 in FIG. 6, the variable gain amplifiers 22a to 22c appropriately multiply by coefficient the outputs from the flat-band amplifier 21a, the primary differentiator 21b and the secondary differentiator 21c, respectively. Further, the mixer 23 adds the respective multiplied outputs. Thus, the buffer 20 changes the frequency characteristics such that a waveform of the actual clock approximates that of the ideal clock.

Next, the flat-band amplifier 21a in FIG. 6 will be described in detail.

Figure 7:
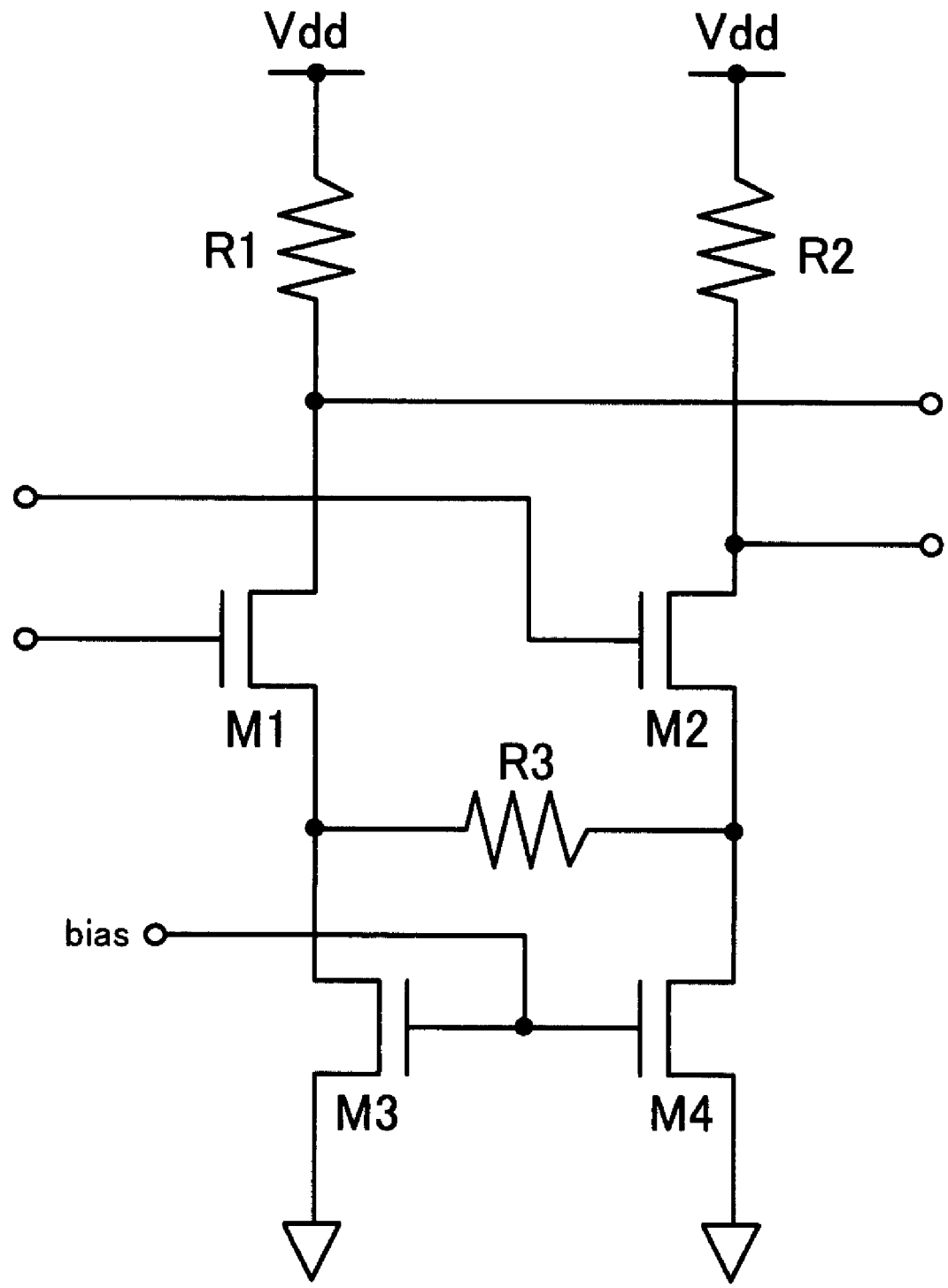
FIG. 7 is a circuit diagram of a flat-band amplifier in FIG. 6.

FIG. 7 is a circuit diagram of the flat-band amplifier 21a in FIG. 6. As shown in FIG. 7, the flat-band amplifier 21a has resistors R1 to R3 and NMOS transistors M1 to M4. Each one end of the resistors R1 and R2 is connected to a power supply of a voltage Vdd, and each other end of the resistors R1 and R2 is connected to each drain of the transistors M1 and M2. The resistor R3 is connected between sources of the transistors M1 and M2. Drains of the transistors M3 and M4 are connected to sources of the transistors M1 and M2, respectively. Sources of the transistors M3 and M4 are connected to ground.

The transistors M1 and M2 form a differential input pair of transistors. The transistors M3 and M4 are bias transistors for the transistors M1 and M2. When a bias voltage bias is input to gates of the transistors M3 and M4, a bias current flows through the transistors M1 and M2. By such circuitry, the flat-band amplifier 21a functions as a circuit which has the transfer function with a pole and in which at frequencies below the cutoff frequency, the gain is constant almost regardless of the frequency and the phase changes depending on the frequency.

Next, the primary differentiator 21b in FIG. 6 will be described in detail.

Figure 8:
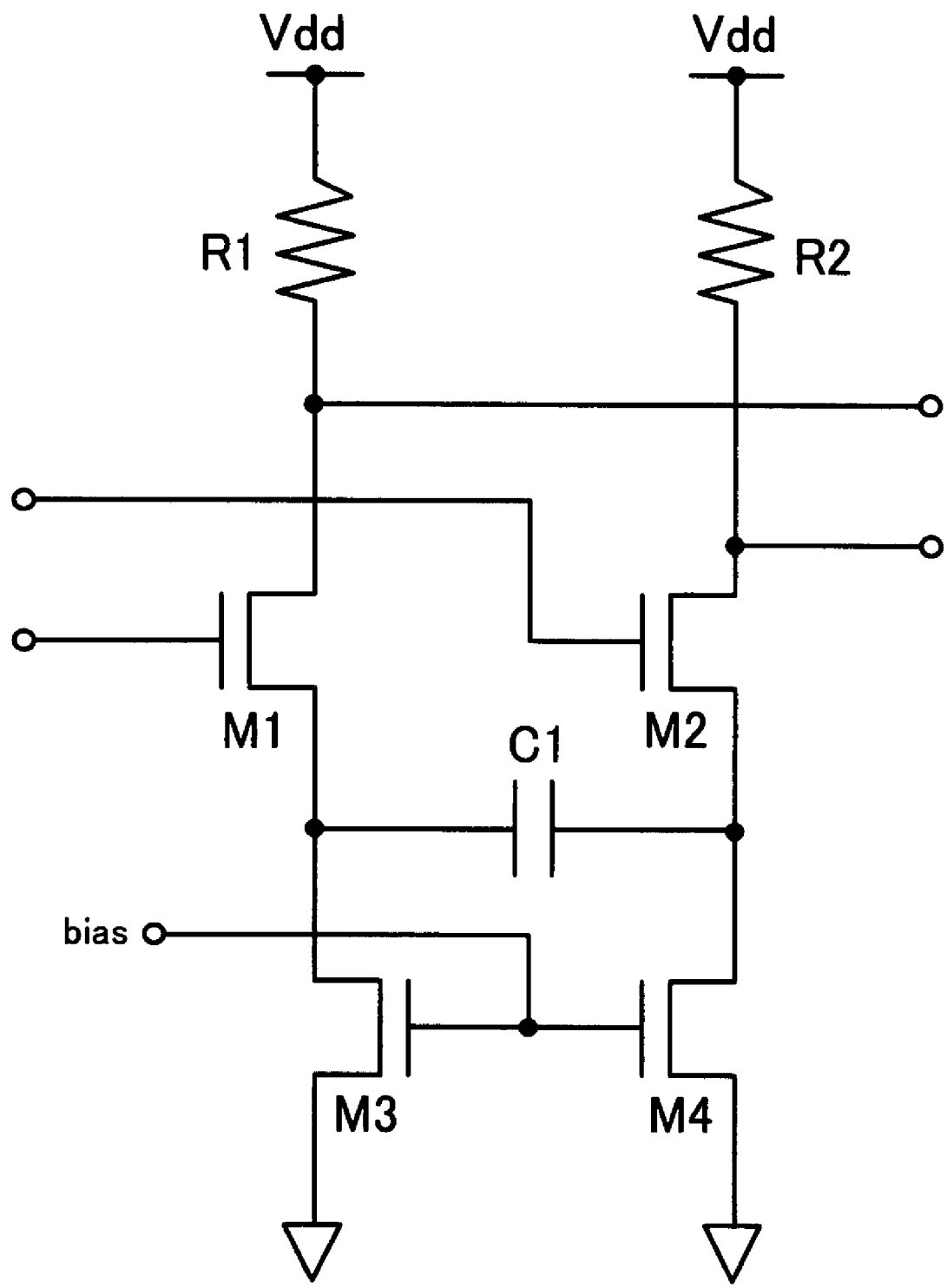
FIG. 8 is a circuit diagram of a primary differentiator in FIG. 6.

FIG. 8 is a circuit diagram of the primary differentiator 21b in FIG. 6. In FIG. 8, the same elements as those shown in FIG. 7 are indicated by the same reference numerals as in FIG. 7 and the description is omitted.

In the primary differentiator 21b, a capacitor C1 is used instead of the resistor R3 of the flat-band amplifier 21a. By such circuitry, the primary differentiator 21b functions as a circuit having the transfer function with a pole and a zero-point, and having a high-pass frequency characteristic.

The secondary differentiator 21c in FIG. 6 can be realized by serially connecting the primary differentiator 21b shown in FIG. 8. A gain slope versus frequency of the primary differentiator 21b is 20 dB/decade, and a gain slope versus frequency of the secondary differentiator 21c is 40 dB/decade. Accordingly, the buffer 20 has a band-pass frequency characteristic with a zero slope, 20 dB/decade slope, 40 dB/decade slope, zero slope and negative slope in ascending order of frequencies. The reason why the frequency characteristic has a negative slope at high frequencies is that a band-pass frequency characteristic is limited by the characteristics of transistors constituting the differentiators. The pass band includes the fundamental frequency of the actual clock.

Next, another circuit example of the buffer 20 in FIG. 3 will be described in detail.

Figure 9:
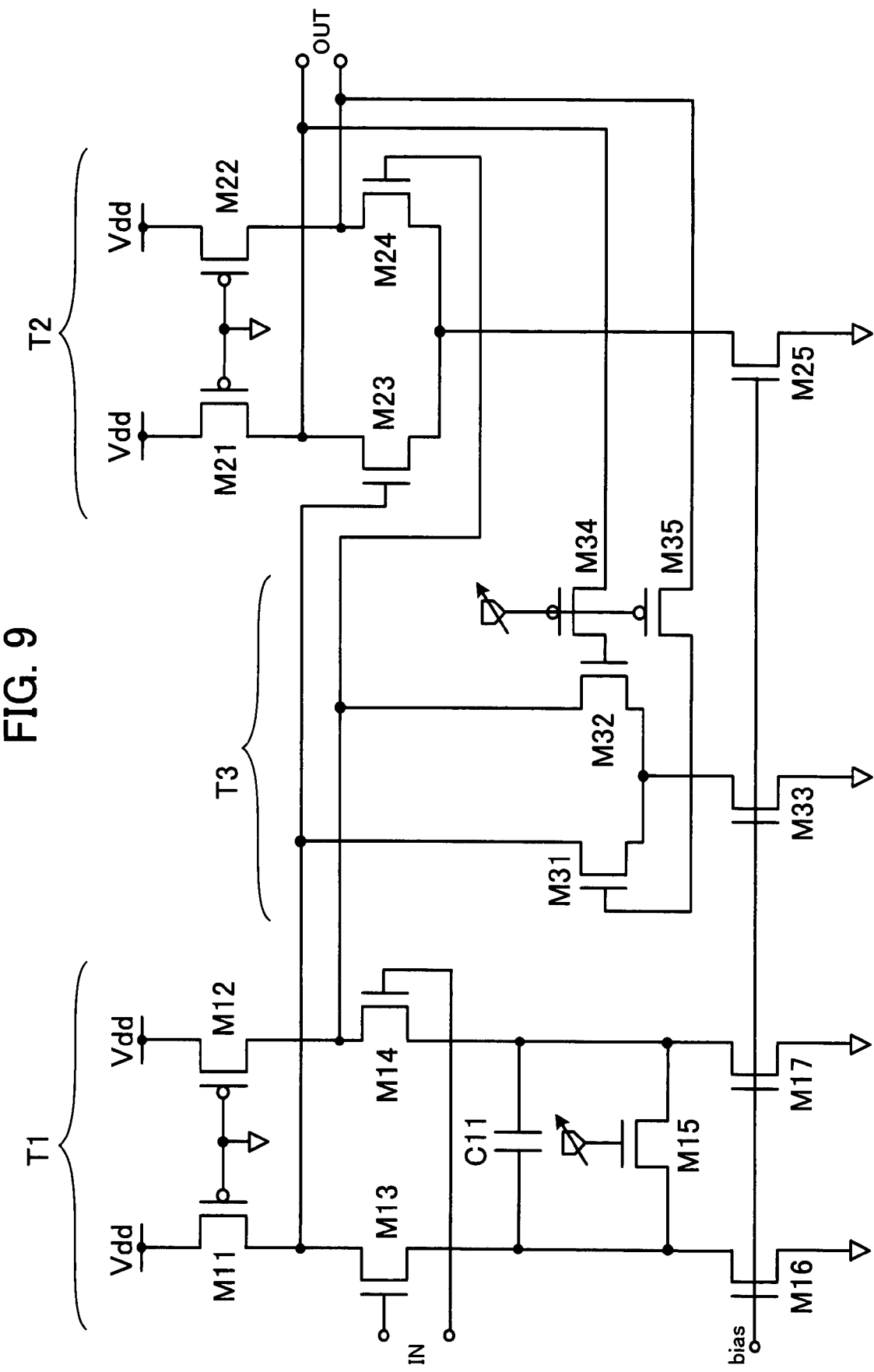
FIG. 9 is another circuit diagram of the buffer in FIG. 3.

FIG. 9 is another circuit diagram of the buffer 20 in FIG. 3. The buffer 20 shown in FIG. 9 is roughly divided into three circuit portions of regions T1, T2 and T3. Each circuit shown in the regions T1 to T3 forms a differential circuit. The output of the differential circuit in the region T1 is input to the differential circuit in the region T2. The differential circuit in the region T3 negatively feeds back the output of the differential circuit in the region T2 to the input thereof.

The differential circuit in the region T1 has PMOS transistors M11 and M12, NMOS transistors M13 to M17, and a capacitor C11. Sources of the transistors M11 and M12 are connected to a power supply of the voltage Vdd, and gates of the transistors M11 and M12 are connected to ground.

Drains of the transistors M13 and M14 are connected to drains of the transistors M11 and M12, respectively. Between sources of the transistors M13 and M14, the capacitor C11 and the transistor M15 are connected. To the sources of the transistors M13 and M14, drains of the transistors M16 and M17 are connected, respectively. To gates of the transistors M13 and M14, the actual clock input to the input terminal IN is input.

The transistors M13 and M14 form a differential input pair of transistors. The transistors M16 and M17 are bias transistors for the transistors M13 and M14. When a bias voltage bias is input to the gates of the transistors M16 and M17, a bias current flows through the transistors M13 and M14.

The transistor M15 is used as a variable resistor, and a gate thereof is connected to the parameter adjustment circuit 13 shown in FIG. 3. The transfer function of the differential circuit in the region T1 has a zero point. A position of the zero point can be changed by adjusting a gate voltage of the transistor M15.

The differential voltage signals input to the gates of the transistors M13 and M14 forming the differential input pair are amplified and output from the drains of the transistors M13 and M14 to the differential circuit in the region T2.

The differential circuit in the region T2 has PMOS transistors M21 and M22, and NMOS transistors M23 to M25. Sources of the transistors M21 and M22 are connected to a power supply of the voltage Vdd, and gates of the transistors M21 and M22 are connected to ground.

Drains of the transistors M23 and M24 are connected to drains of the transistors M21 and M22, respectively. Sources of the transistors M23 and M24 are connected to each other and connected to a drain of the transistor M25. To gates of the transistors M23 and M24, signals output from the differential circuit in the region T1 are input.

The transistors M23 and M24 form a differential input pair of transistors. The transistor M25 is a bias transistor for the transistors M23 and M24. When a bias voltage bias is input to the gate of the transistor M25, a bias current flows through the transistors M23 and M24.

The differential voltage signals input to the gates of the transistors M23 and M24 forming the differential input are amplified and output from the drains of the transistors M23 and M24 to the output terminal OUT as well as to the differential circuit in the region T3.

The differential circuit in the region T3 has NMOS transistors M31 to M33 and PMOS transistors M34 and M35. Drains of the transistors M31 and M32 are connected to the gates of the transistors M23 and M24, respectively. Sources of the transistors M31 and M32 are connected to each other and connected to a drain of the transistor M33. Gates of the transistors M31 and M32 are connected to the drains of the transistors M23 and M24 through the transistors M35 and M34, respectively.

The transistors M31 and M32 form a differential input pair of transistors. The transistor M33 is a bias transistor for the transistors M31 and M32. When a bias voltage bias is input to the gate of the transistor M33, a bias current flows through the transistors M31 and M32.

The differential voltage signals input to the gates of the transistors M31 and M32 forming the differential input are output from the drains of the transistors M31 and M32 to the gates of the transistors M23 and M24 so as to be negatively fed back to the input of the differential circuit in the region T2.

The transistors M34 and M35 are used as variable resistors, and the gates thereof are connected to the parameter adjustment circuit 13 shown in FIG. 3. The differential circuit in the region T3 introduces a second zero point into the transfer function by applying negative feedback to the differential circuit in the region T2. The zero point can be moved by adjusting the gate voltages of the transistors M34 and M35.

That is, in the buffer 20 shown in FIG. 9, the parameter adjustment circuit 13 changes resistance values of the transistor M15 and the transistors M34 and M35 to thereby move the zero point of the differential circuit in the region T1 and the zero point of the differential circuits in the regions T2 and T3. Thus, the buffer 20 changes the frequency characteristics such that a waveform of the actual clock approximates that of the ideal clock.

Next, the frequency characteristics of the buffer 20 shown in FIG. 9 will be described.

Figure 10:
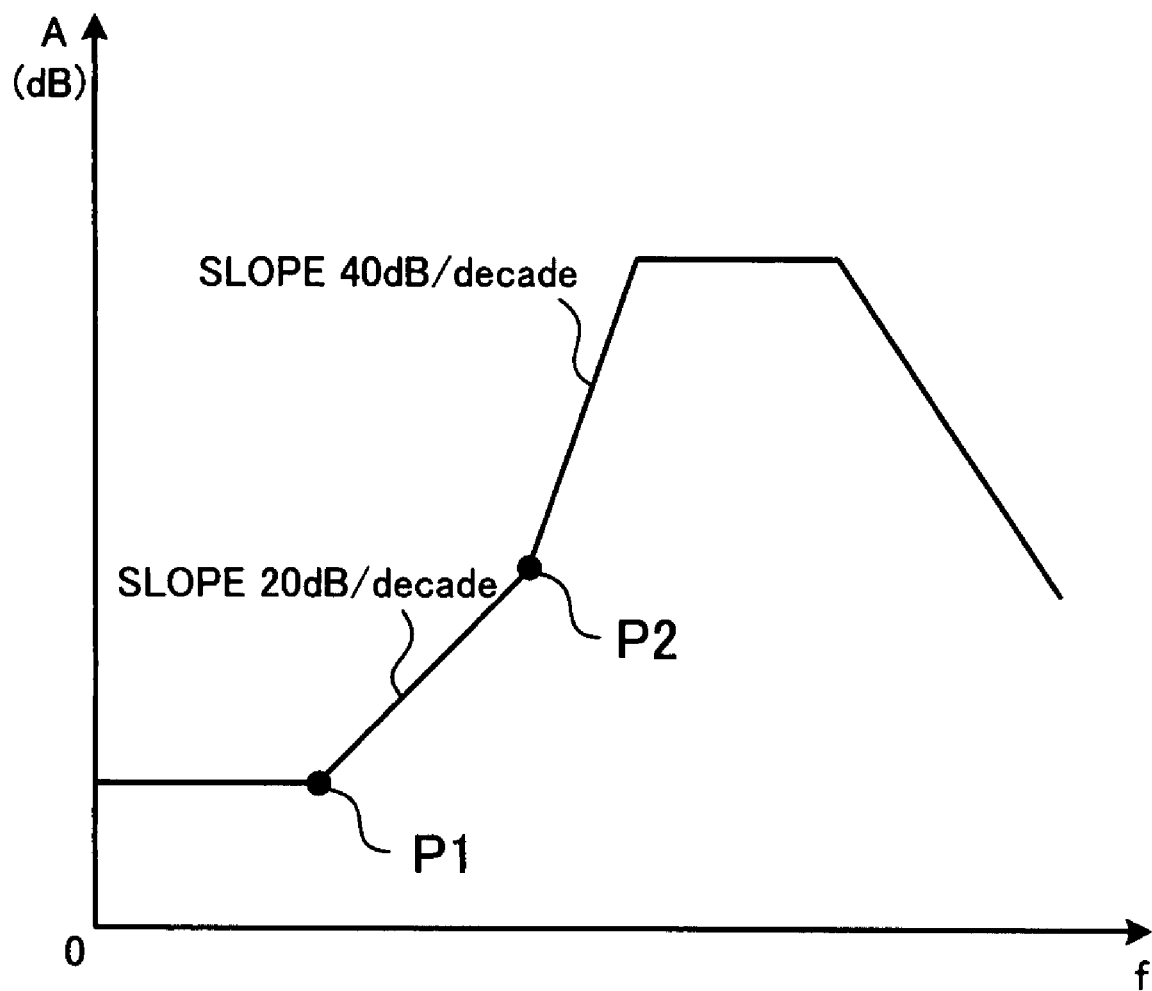
FIG. 10 shows frequency characteristics of the buffer in FIG. 9.

FIG. 10 shows frequency characteristics of the buffer 20 in FIG. 9. As shown in FIG. 10, the buffer 20 shown in FIG. 9 has a band-pass frequency characteristic with a 20 dB/decade slope and a 40 dB/decade slope.

The slope change at point P1 in FIG. 10 is caused by the zero point of the differential circuit in the region T1 shown in FIG. 9, and the slope change at point P2 in FIG. 10 is caused by the zero point of the differential circuits in the regions T2 and T3 shown in FIG. 9. As described above, when the resistance value of the transistor M15 in the region T1 is changed, the zero point of the differential circuit in the region T1 is moved, so that the point P1 can be moved. Further, when the resistance values of the transistors M34 and M35 in the region T3 are changed, the zero point of the differential circuit in the region T3 is moved, so that the point P2 can be moved. That is, when the parameter adjustment circuit 13 changes the resistance values of the transistors M15, M34 and M35, the buffer 20 can realize the desired frequency characteristics so that a waveform of the actual clock can approximate that of the ideal clock. The pass band includes the fundamental frequency of the actual clock.

Thus, the frequency characteristics are changed such that a waveform of the actual clock approximates that of the ideal clock, and at the same time, a gain for attenuating signals is provided at frequencies below the pass band including the fundamental frequency. As a result, noise at frequencies below the fundamental frequency f0 of the actual clock is reduced, so that jitter can be reduced. Further, a DC component included in the actual clock is suppressed, so that disappearance of the actual clock can be prevented.

Further, it is possible to propagate a clock without using a relatively large feedback circuit for coping with the offset voltage and a circuit for reducing noise.

In the case where a frequency of the actual clock is known, the ideal clock output control circuit 11 need not change a frequency of the ideal clock internally generated. In this case, the circuit 11 may generate the ideal clock at the known frequency of the actual clock and may change only a phase of the ideal clock.

Further, in the case where a frequency of the actual clock is known, values of circuit elements of the buffer 20 may be determined and fixed in the designing such that the center of the pass band of the buffer 20 shown in FIGS. 6 and 10 is a frequency of the actual clock. As a result, even if the buffer control circuit 10 is not provided, noise at frequencies below the fundamental frequency of the actual clock is reduced, so that jitter can be reduced. At the same time, the offset voltage included in the clock is suppressed, so that disappearance of the clock can be prevented.

The examples of the buffer 20 are shown in FIGS. 6 and 9, but the embodiment is not limited thereto as long as the frequency characteristics can be adjusted.

Next, another embodiment will be described in detail with reference to the accompanying drawings. In the embodiment, a spectrum of the clock input to the clock buffer is detected and a gain near the fundamental frequency of the clock is sufficiently increased as well as a gain at frequencies below the fundamental frequency is sufficiently reduced, thereby reducing jitter and appropriately preventing disappearance of the clock.

Figure 11:
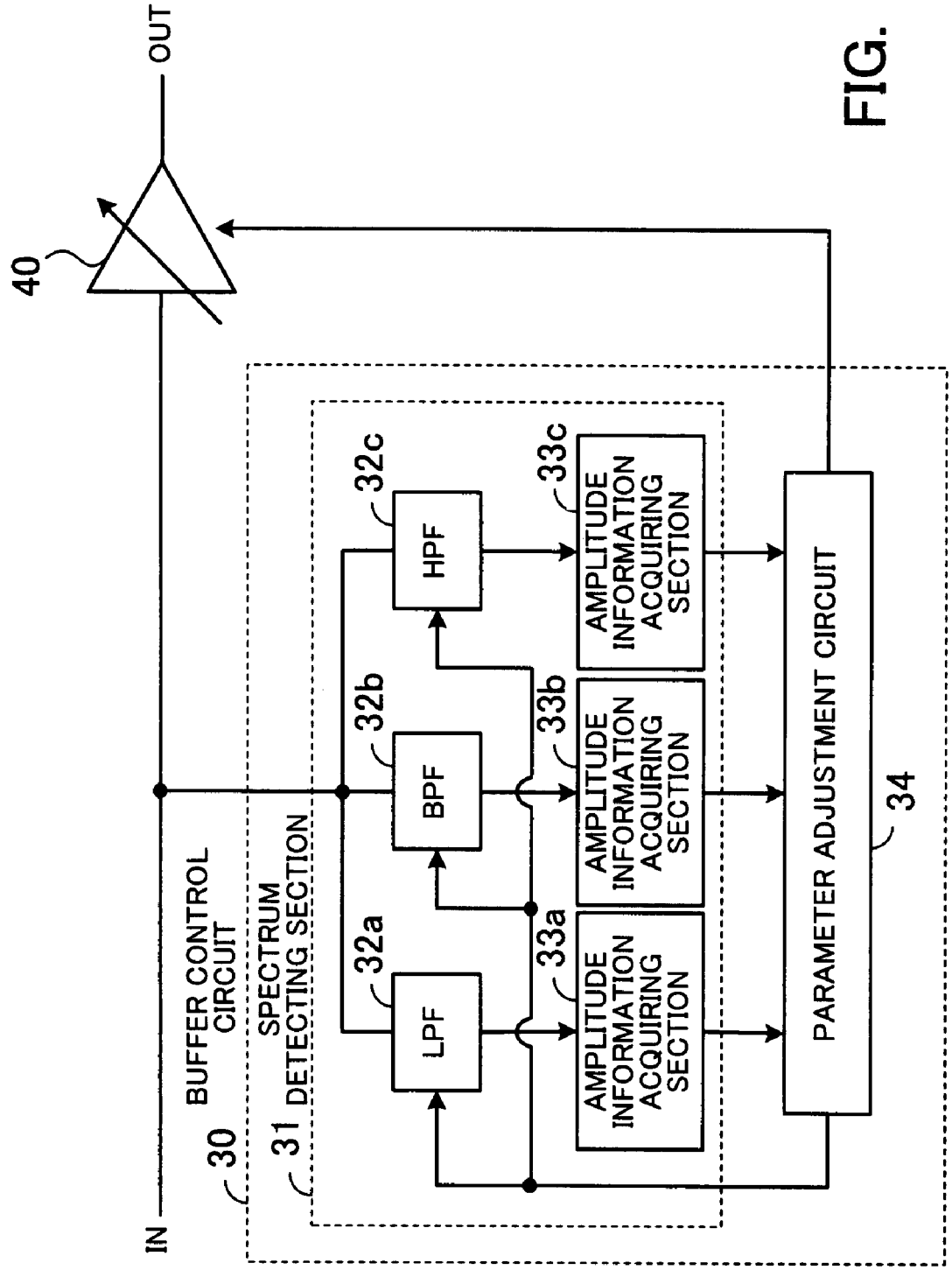
FIG. 11 is a block diagram of a clock buffer according to another embodiment.

FIG. 11 is a block diagram of the clock buffer according to the embodiment. As shown in FIG. 11, the clock buffer comprises a buffer control circuit 30 and a buffer 40.

To the clock buffer, clocks having various frequencies such as 500 MHz, 1 GHz and 2 GHz are input from the input terminal IN. Further, a clock having a known fixed frequency is input. In the case where clocks having various frequencies are input to the input terminal IN, the buffer control circuit 30 detects a spectrum of the clock (hereinafter, referred to as an actual clock) input from the input terminal IN and acquires the fundamental frequency of the actual clock. Further, the circuit 30 controls the buffer 40 such that a gain near the fundamental frequency of the actual clock is sufficiently increased as well as a gain at frequencies below the fundamental frequency is sufficiently reduced.

On the other hand, in the case where a frequency of the actual clock is known, the buffer control circuit 30 detects whether large noise is superimposed on signals having frequencies other than the fundamental frequency of the actual clock. Then, the circuit 30 controls the buffer 40 such that a gain is reduced at the frequencies of the noise.

By control of the buffer control circuit 30, the buffer 40 can change the frequency characteristics to thereby shape the actual clock into a desired waveform and output the resulting clock to the output terminal OUT. When the actual clock passes through a clock line or a predetermined circuit, the amplitude of the clock may be attenuated and accordingly, the clock buffer is generally designed to have a predetermined gain.

The buffer control circuit 30 includes a spectrum detecting section 31 for detecting a spectrum of the actual clock, and a parameter adjustment circuit 34 for controlling the buffer 40 according to the spectrum of the actual clock detected by the spectrum detecting section 31. The spectrum detecting section 31 has an LPF (low-pass filter) 32a, a BPF (band-pass filter) 32b, an HPF (high-pass filter) 32c and amplitude information acquiring sections 33a to 33c.

The LPF 32a passes signals having frequencies below the cutoff frequency. The LPF 32a can change this cutoff frequency by control of the parameter adjustment circuit 34. Therefore, the LPF 32a can be designed to pass a predetermined low frequency component of the actual clock and not to pass a predetermined high frequency component thereof.

The BPF 32b passes signals whose frequency lies in a certain frequency band. The BPF 32b can change its pass band by control of the parameter adjustment circuit 34. Therefore, the BPF 32b can be designed to pass only a predetermined frequency band of the actual clock.

The HPF 32c passes signals having frequencies above the cutoff frequency. The HPF 32c can change this cutoff frequency by control of the parameter adjustment circuit 34. Therefore, the HPF 32c can be designed to pass a predetermined high frequency component of the actual clock and not to pass a predetermined low frequency component thereof.

The amplitude information acquiring section 33a acquires the amplitude of frequency components of the actual clock output from the LPF 32a and calculates amplitude intensities (obtained by squaring the amplitude). In the same manner as in the amplitude information acquiring section 33a, the amplitude information acquiring sections 33b and 33c also acquire the amplitude of frequency components of the actual clock output from the BPF 32b and the HPF 32c and calculate the amplitude intensities.

The parameter adjustment circuit 34, in the case where the fundamental frequency of the actual clock is unknown, that is, in the case where the actual clocks with various frequencies are input to the input terminal IN, controls the BPF 32b such that a pass band of the BPF 32b moves, for example, from the lower frequency to the higher frequency. Then, the circuit 34 monitors the amplitude intensities output from the amplitude information acquiring section 33b and acquires a frequency having the largest amplitude as the fundamental frequency of the actual clock.

The parameter adjustment circuit 34, when acquiring the fundamental frequency of the actual clock, controls the buffer 40 such that a gain at frequencies below the fundamental frequency is sufficiently reduced. Thus, a DC component included in the actual clock is reduced by the buffer 40. Accordingly, even if the clock buffers are connected in multiple stages, a DC component is not amplified and therefore, the actual clock is prevented from disappearing. Further, by reducing a gain at frequencies below the fundamental frequency of the actual clock, noise at the frequencies can be removed so that jitter can be reduced. The gain at frequencies below the fundamental frequency of the actual clock is preferably sufficiently reduced, and may be at least less than 0 dB.

On the other hand, in the case where the fundamental frequency of the actual clock is known, the parameter adjustment circuit 34 need not acquire the fundamental frequency of the actual clock by controlling the BPF 32b such that a pass band of the BPF 32b moves from the lower frequency to the higher frequency. In this case, the circuit 34 controls the LPF 32a and the HPF 32c to form a non-pass band which prohibits signals centered around the known fundamental frequency of the actual clock from passing therethrough. Further, the circuit 34 monitors the amplitude intensities output from the amplitude information acquiring sections 33a and 33c. Then, according to the amplitude intensity at the frequencies other than the fundamental frequency of the actual clock, the circuit 34 determines that a signal having a certain frequency is noise, and acquires the frequency of the noise.

The parameter adjustment circuit 34, when acquiring the frequency of the signal determined as noise, controls the buffer 40 such that a gain at the frequency is sufficiently reduced. Further, the circuit 34 controls the buffer 40 such that a gain at low frequencies is sufficiently reduced to remove a DC component included in the actual clock. Thus, the DC component included in the actual clock is reduced by the buffer 40. Accordingly, even if the clock buffers are connected in multiple stages, the DC component is not amplified and therefore, the actual clock is prevented from disappearing. Further, noise superimposed on the actual clock can be reduced so that jitter can be reduced. The gain at frequencies below the fundamental frequency of the actual clock is preferably sufficiently reduced, and may be at least less than 0 dB.

Next, control of the LPF 32a, the BPF 32b and the HPF 32c by the parameter adjustment circuit 34 will be described.

Figure 12:
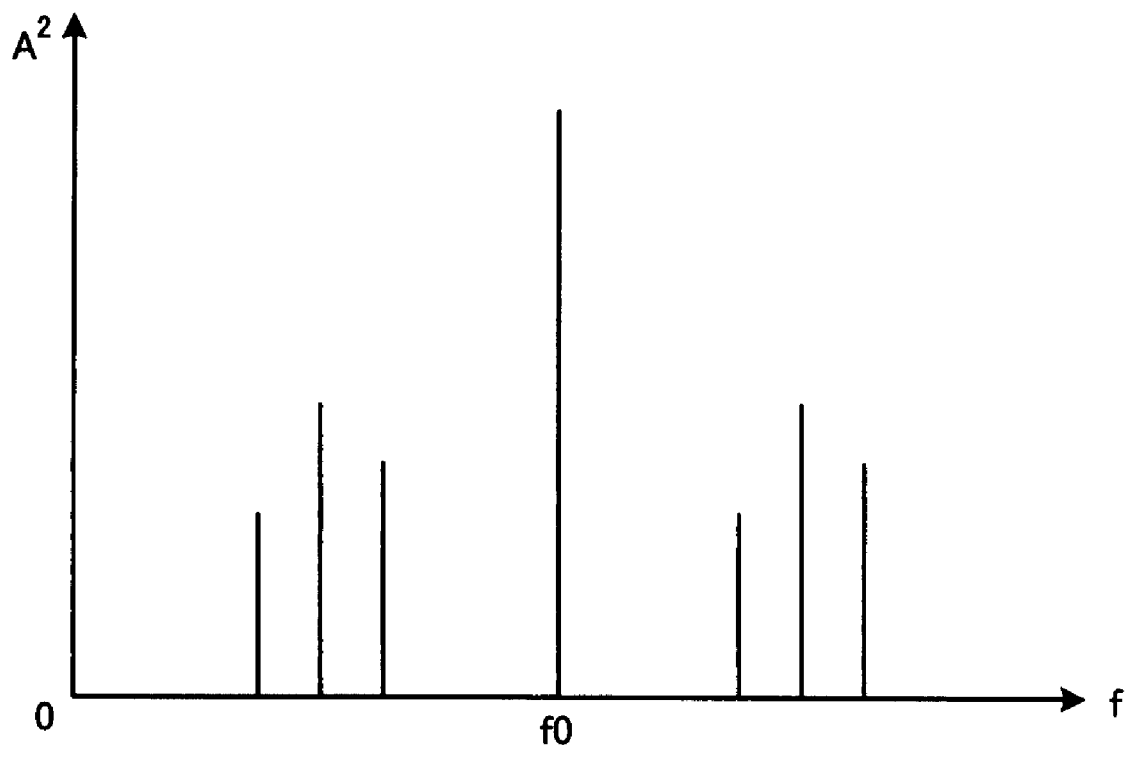
FIG. 12 illustrates control of an LPF, a BPF and an HPF by a parameter adjustment circuit.
Figure 12:
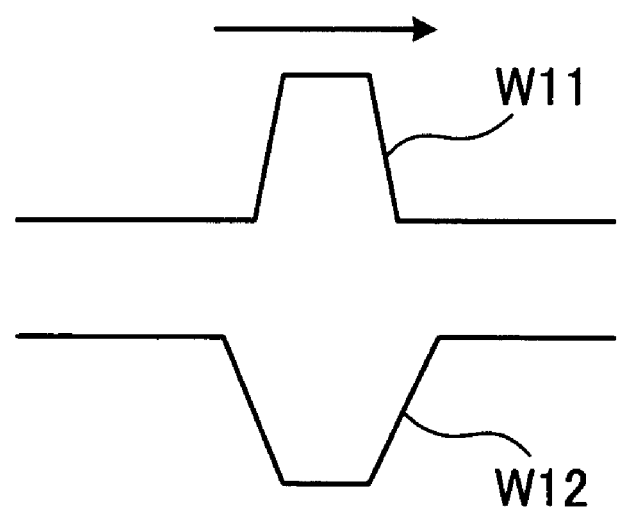

FIG. 12 illustrates the control of the LPF 32a, the BPF 32b and the HPF 32c by the parameter adjustment circuit 34. FIG.

12 shows frequency characteristics of the actual clock, a waveform W11 showing the frequency characteristics of the BPF 32b, and a waveform W12 showing the frequency characteristics of the LPF 32a and the HPF 32c. The fundamental frequency of the actual clock is represented by f0.

In the case where the fundamental frequency of the actual clock is unknown, the parameter adjustment circuit 34 controls the BPF 32b such that a pass band of the BPF 32b moves from the lower frequency to the higher frequency as shown by the waveform W11. Thus, the circuit 34 can acquire amplitude intensities of the actual clock at each frequency. From the figure, it is seen that among the acquired amplitude intensities of the actual clock, a frequency having the largest amplitude is the fundamental frequency f0 of the actual clock.

On the other hand, in the case where the fundamental frequency of the actual clock is known, the parameter adjustment circuit 34 need not control the BPF 32b such that a pass band of the BPF 32b moves from the lower frequency to the higher frequency. In this case, the circuit 34 controls the LPF 32a and the HPF 32c to realize the frequency characteristics as shown by the waveform W12. That is, the circuit 34 controls the LPF 32a and the HPF 32c to realize a filter which passes signals having frequencies other than the fundamental frequency f0. As a result, the circuit 34 can acquire signals having frequencies other than the fundamental frequency of the actual clock. Further, the circuit 34 can determine that in the amplitude intensities of the acquired signals, a signal with a frequency having the amplitude clearly larger than other amplitudes is noise.

Thus, the parameter adjustment circuit 34 controls the LPF 32a, the BPF 32b and the HPF 32c.

Next, description will be made on the case of realizing the functions of the spectrum detecting section 31 in FIG. 11 in digital form and the case of realizing the functions thereof in analog form will be described. First, description will be made on the case of realizing the functions of the spectrum detecting section 31 in digital form.

Figure 13:
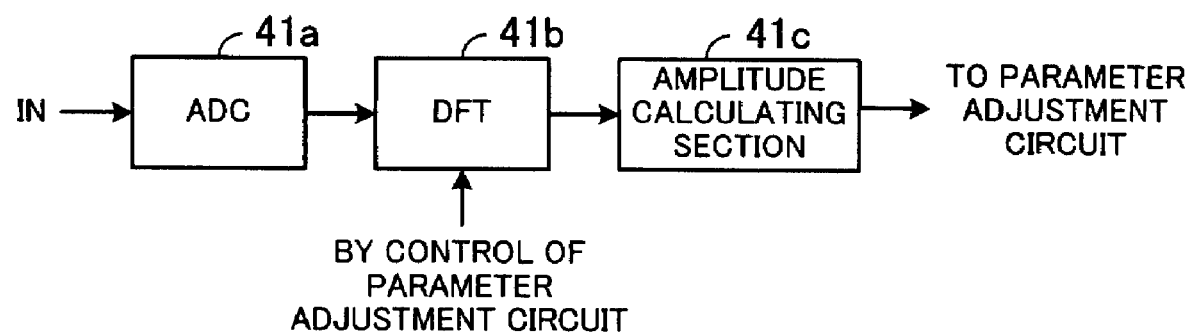
FIG. 13 is a circuit block diagram in the case of realizing the functions of a spectrum detecting section in digital form.

FIG. 13 is a circuit block diagram in the case of realizing the functions of the spectrum detecting section in digital form. As shown in FIG. 13, the spectrum detecting section 31 has an ADC (analog digital converter) 41a, a DFT (discrete Fourier transform) 41b and an amplitude calculating section 41c.

The ADC 41a converts from analog to digital the actual clock input to the input terminal IN. The DFT 41b calculates the size of the amplitude at each frequency of the digitally converted actual clock. The amplitude calculating section 41c squares the amplitude calculated by the DFT 41b and outputs the squared amplitude as the amplitude intensity to the parameter adjustment circuit 34.

The DFT 41b can output the size of the amplitude at the predetermined frequency by control of the parameter adjustment circuit 34. In other words, the DFT 41b also serves as a filter. For example, in the case where the fundamental frequency of the actual clock is unknown, the DFT 41b outputs the size of the amplitude at each frequency of the actual clock in ascending order of frequencies. In the case where the fundamental frequency of the actual clock is known, the DFT 41b outputs the size of the amplitude at frequencies other than that of the actual clock. Thus, the functions of the spectrum detecting section 31 can be realized in digital form.

Next, description will be made on the case of realizing the functions of the spectrum detecting section 31 in analog form.

Figure 14:
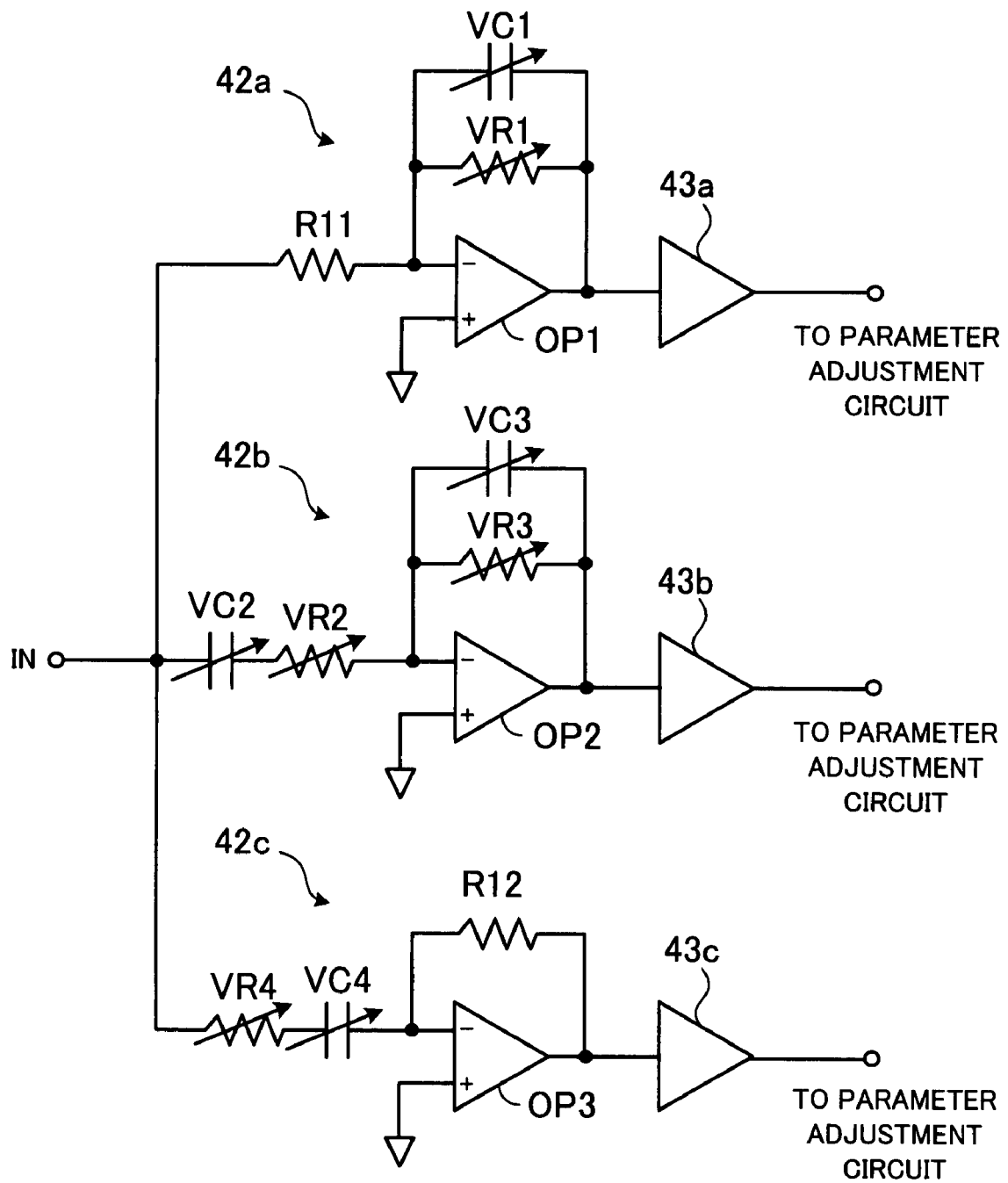
FIG. 14 is a circuit block diagram in the case of realizing the functions of a spectrum detecting section in analog form.

FIG. 14 is a circuit block diagram in the case of realizing the functions of the spectrum detecting section in analog form. As shown in FIG. 14, the spectrum detecting section 31 has an LPF 42a, BPF 42b and HPF 42c each including an operational amplifier, and buffers 43a to 43c.

The LPF 42a includes an operational amplifier OP1, a variable capacitor VC1, a variable resistor VR1 and a resistor R11. Between an output terminal and inverting input terminal of the operational amplifier OP1, the parallel-connected variable capacitor VC1 and variable resistor VR1 are connected. The inverting input terminal of the operational amplifier OP1 is connected to the resistor R11 and the actual clock input from the input terminal IN is input to the inverting input terminal. A non-inverting input terminal of the operational amplifier OP1 is connected to ground. To the output terminal of the operational amplifier OP1, the buffer 43a having an output characteristic proportional to the square of the input is connected.

The LPF 42a passes signals having frequencies below the cutoff frequency, and the buffer 43a outputs the square of the amplitude of the signal to the parameter adjustment circuit 34. The LPF 42a can change this cutoff frequency by changing a capacitance value of the variable capacitor VC1 and a resistance value of the variable resistor VR1. The capacitance value of the variable capacitor VC1 and the resistance value of the variable resistor VR1 are changed by control of the parameter adjustment circuit 34. The inverse number of the product of the capacitance value of the variable capacitor VC1 and the resistance value of the variable resistor VR1 is used as a cutoff angular frequency.

The BPF 42b includes an operational amplifier OP2, variable capacitors VC2 and VC3, and variable resistors VR2 and VR3. Between an output terminal and inverting input terminal of the operational amplifier OP2, the parallel-connected variable capacitor VC3 and variable resistor VR3 are connected. The series-connected variable capacitor VC2 and variable resistor VR2 are connected to the inverting input terminal of the operational amplifier OP2, and the actual clock input from the input terminal IN is input to the inverting input terminal. A non-inverting input terminal of the operational amplifier OP2 is connected to ground. To the output terminal of the operational amplifier OP2, the buffer 43b having an output characteristic proportional to the square of the input is connected.

The BPF 42b passes signals whose frequency lies in a certain frequency band, and the buffer 43b outputs the square of the amplitude of the signal to the parameter adjustment circuit 34. The BPF 42b can change a lower limit frequency of the bandwidth by changing the capacitance value of the variable capacitor VC2 and the resistance value of the variable resistor VR2. Further, the BPF 42b can change an upper limit frequency of the bandwidth by changing the capacitance value of the variable capacitor VC3 and the resistance value of the variable resistor VR3. The capacitance values of the variable capacitors VC1 and VC2 and the resistance values of the variable resistors VR1 and VR2 are changed by control of the parameter adjustment circuit 34. The inverse number of the product of the capacitance value of the variable capacitor VC2 and the resistance value of the variable resistor VR2 is used as a lower limit angular frequency of the bandwidth. Meanwhile, the inverse number of the product of the capacitance value of the variable capacitor VC3 and the resistance value of the variable resistor VR3 is used as an upper limit angular frequency of the bandwidth.

The HPF 42c includes an operational amplifier OP3, a variable capacitor VC4, a variable resistor VR4 and a resistor R12. Between an output terminal and inverting input terminal of the operational amplifier OP3, the resistor R12 is connected. The series-connected variable resistor VR4 and variable capacitor VC4 are connected to the inverting input terminal of the operational amplifier OP3, and the actual clock input from the input terminal IN is input to the inverting input terminal. A non-inverting input terminal of the operational amplifier OP3 is connected to ground. To the output terminal of the operational amplifier OP3, the buffer 43c having an output characteristic proportional to the square of the input is connected.

The HPF 42c passes signals having frequencies above the cutoff frequency, and the buffer 43c outputs the square of the amplitude of the signal to the parameter adjustment circuit 34. The HPF 42c can change this cutoff frequency by changing a resistance value of the variable resistor VR4 and a capacitance value of the variable capacitor VC4. The resistance value of the variable resistor VR4 and the capacitance value of the variable capacitor VC4 are changed by control of the parameter adjustment circuit 34. The inverse number of the product of the resistance value of the variable resistor VR4 and the capacitance value of the variable capacitor VC4 is used as a cutoff angular frequency.

As described above, the LPF 42a and the HPF 42c are used for the noise detection in the case where a fundamental frequency of the actual clock is known. Therefore, the cutoff frequency need not be changed and may be a fixed frequency. However, when the LPF 42a and the HPF 42c are designed to change the cutoff frequency as shown in FIG. 14, adjustment for the noise detection can be performed according to variations of elements or applications using the clock buffer.

Next, the buffer 40 in FIG. 11 will be described in detail.

Figure 15:
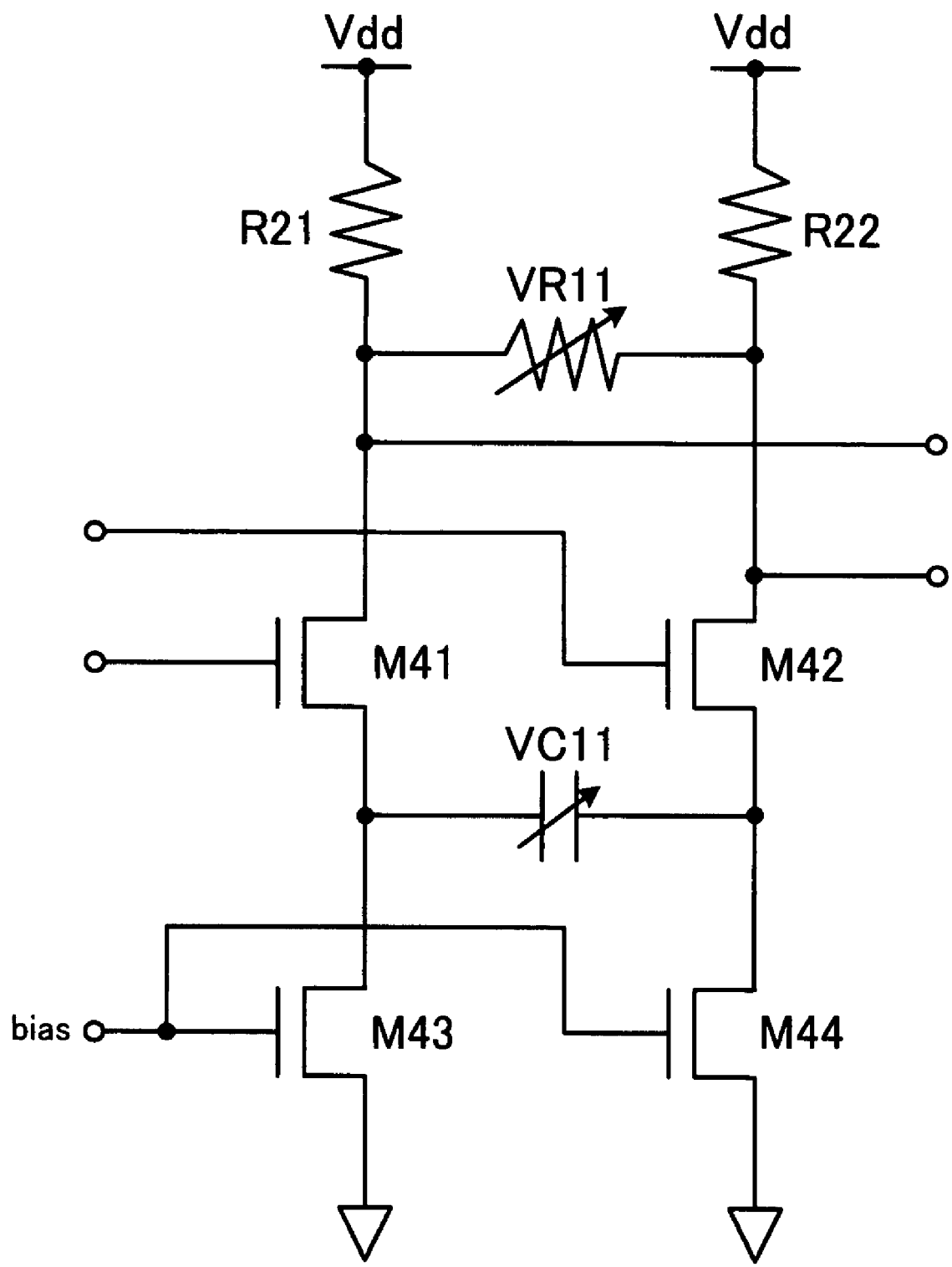
FIG. 15 is a circuit diagram of the buffer in FIG. 11.

FIG. 15 is a circuit diagram of the buffer in FIG. 11. As shown in FIG. 15, the buffer 40 has resistors R21 and R22, a variable resistor VR11, a variable capacitor VC11 and NMOS transistors M41 to M44.

Each one end of the resistors R21 and R22 is connected to a power supply of a voltage Vdd, and each other end of the resistors R21 and R22 is connected to each drain of the transistors M41 and M42. Between the drains of the transistors M41 and M42, the variable resistor VR11 is connected. Between sources of the transistors M41 and M42, the variable capacitor VC11 is connected. Drains of the transistors M43 and M44 are connected to the sources of the transistors M41 and M42, respectively. Sources of the transistors M43 and M44 are connected to ground.

The transistors M41 and M42 form a differential input pair of transistors. The transistors M43 and M44 are bias transistors for the transistors M41 and M42. When a bias voltage bias is input to the gates of the transistors M43 and M44, a bias current flows through the transistors M41 and M42.

When a signal of differential voltage is input to gates of the transistors M41 and M42, a differential current flows through the transistors M41 and M42. By the differential current, the voltage is caused in the resistors R21 and R22 and taken out as the output.

The transfer function of the buffer 40 has a zero point and a pole. In the buffer 40, the frequency of the zero point in the transfer function can be adjusted by changing the capacitance value of the variable capacitor VC11. Further, the frequency of the pole in the transfer function can be adjusted by changing the resistance value of the variable resistor VR11. The resistance value of the variable resistor VR11 and the capacitance value of the variable capacitor VC11 are changed by the parameter adjustment circuit 34 shown in FIG. 11.

Here, there will be described a case where the capacitance value of the variable capacitor VC11 is small. For a signal having a predetermined frequency input to the transistors M41 and M42, the circuit including the resistor R21 and the transistors M41 and M43 and the circuit including the resistor R22 and the transistors M42 and M44 are separated from each other (here, the variable resistor VR11 is not taken into consideration), and as a result, the differential current is prevented from flowing in the transistors M41 and M42. Next, there will be described a case where the capacitance value of the variable capacitor VC11 is large. For a signal having a predetermined frequency input to the transistors M41 and M42, the circuit including the resistor R21 and the transistors M41 and M43 and the circuit including the resistor R22 and the transistors M42 and M44 are short-circuited in the sources of the transistors M41 and M42, and as a result, the differential current flows in the transistors M41 and M42. In other words, when the capacitance value of the variable capacitor VC11 is large, the coupling between the circuit including the resistor R21 and the transistors M41 and M43 and the circuit including the resistor R22 and the transistors M42 and M44 is enhanced even in the signal having a low frequency, and as a result, the signal can be amplified. Meanwhile, when the capacitance value of the variable capacitor VC11 is small, the coupling between the circuit including the resistor R21 and the transistors M41 and M43 and the circuit including the resistor R22 and the transistors M42 and M44 is weakened in the signal having a low frequency, and as a result, the signal cannot be amplified.

Between output and input terminals for signals, the variable resistor VR11 is connected in parallel to the variable capacitor VC11, and thereby forming the LPF. Accordingly, the cutoff frequency of the buffer 40 can be changed by changing the resistance value of the variable resistor VR11. When the resistance value of the variable resistor VR11 is increased, the cutoff frequency can be moved to a higher frequency, whereas when the resistance value of the variable resistor VR11 is reduced, the cutoff frequency can be moved to a lower frequency.

By controlling the resistance value of the variable resistor VR11 and the capacitance value of the variable capacitor VC11, the parameter adjustment circuit 34 can change the frequency characteristics of the buffer 40. For example, the circuit 34 changes the transfer function of the buffer 40 such that the spectrum obtained by multiplying a spectrum calculated using the spectrum detecting section 31 by the frequency characteristics of the buffer 40 is a desired spectrum of the actual clock. The reason for performing multiplication is that the spectrum of an output waveform of the buffer 40 is a spectrum obtained by multiplying an input spectrum to the buffer 40 by the transfer function of the buffer 40. A spectrum of the actual clock is calculated by the spectrum detecting section 31, and the desired spectrum of the actual clock is known. Therefore, the transfer function of the buffer 40 is found.

Next, the frequency characteristics of the buffer 40 will be described.

Figure 16:
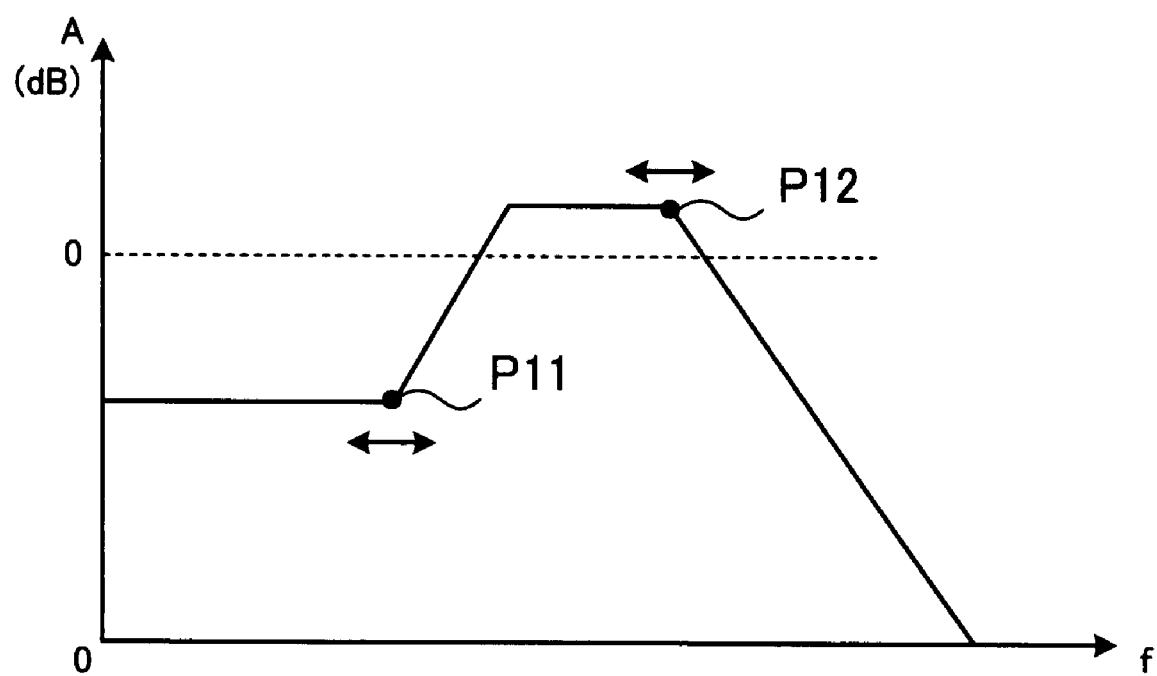
FIG. 16 shows frequency characteristics of the buffer in FIG. 15.

FIG. 16 shows frequency characteristics of the buffer 40 in FIG. 15. As shown in FIG. 16, the buffer 40 has the frequency characteristics with pass bandwidth. A point P11 shown in FIG. 16 can be moved by changing the capacitance value of the variable capacitor VC11 in the buffer 40 shown in FIG. 15. For example, as described above, when the capacitance value of the variable capacitor VC11 is increased, also a signal having a low frequency passes through the variable capacitor VC11 and therefore, the point P11 moves to the left in FIG. 16.

A point P12 shown in FIG. 16 can be moved by changing the resistance value of the variable resistor VR11 in the buffer 40 shown in FIG. 15. For example, as described above, when the resistance value of the variable resistor VR11 is increased, a signal hardly passes through the variable resistor VR11 and therefore, the point P12 moves to the right in FIG. 16.

Thus, the clock buffer is designed such that a pass band of the clock buffer includes the fundamental frequency f0 of the actual clock and a gain for attenuating signals is provided at frequencies below the pass band. As a result, noise at frequencies below the fundamental frequency of the actual clock is reduced, so that jitter can be reduced. Further, a DC component included in the actual clock is suppressed, so that disappearance of the actual clock can be prevented.

Further, it is possible to propagate a clock without using a relatively large feedback circuit for coping with the offset voltage and a circuit for reducing noise.

In addition, a gain in the pass band of the buffer 40 is set to 0 dB or more, and a gain at frequencies below or above the pass band is set to sufficiently lower than 0 dB. In other words, the fundamental frequency of the actual clock is amplified and frequencies other than the fundamental frequency are not amplified, thereby preventing the DC component or noise from being included in the actual clock.

Further, in the case where a frequency of the actual clock is known, values of the circuit elements of the buffer 40 may be determined and fixed in the designing such that a center of the pass band of the buffer 40 shown in FIG. 15 is a frequency of the actual clock. As a result, even if the buffer control circuit 30 is not provided, noise at frequencies below the fundamental frequency of the actual clock is reduced, so that jitter can be reduced. At the same time, the offset voltage included in the clock is suppressed, so that disappearance of the clock can be prevented. The values of circuit elements in this case can be determined using the same method as the above-described determination method of the transfer function.

The example of the buffer 40 is shown in FIG. 15, but the another embodiment is not limited thereto as long as the frequency characteristics can be adjusted. For example, the buffer 20 shown in FIGS. 6 and 9 may be used.

Next, another embodiment will be described in detail with reference to the accompanying drawings. This embodiment shows examples of various connection relationships between the buffer control circuit and buffer described in aforementioned embodiments.

Figure 17A:
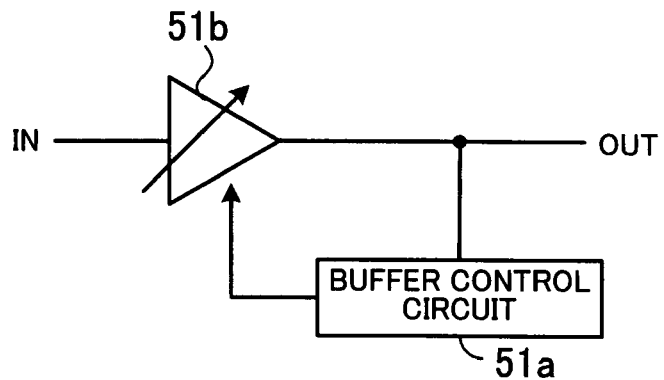
FIGS. 17A to 17C are block diagrams of a clock buffer according to another embodiment.

FIG. 17 is a block diagram of the clock buffer according to this embodiment. A buffer control circuit 51a and buffer 51b shown in FIG. 17A have the same constitutions as those of the buffer control circuit 10 and buffer 20 described in the embodiment. Further, the buffer control circuit 51a and buffer 51b shown in FIG. 17A have the same constitutions as those of the buffer control circuit 30 and buffer 40 described in the second embodiment.

The buffer control circuit 51a controls the buffer 51b according to the actual clock output from the buffer 51b. That is, the buffer control circuit 10 and buffer 20 described in the embodiment can waveform-shape the actual clock also based on the connection relationship as shown in FIG. 17A. Further, the buffer control circuit 30 and buffer 40 described in the second embodiment also can waveform-shape the actual clock based on the connection relationship as shown in FIG. 17A.

In the clock buffer shown in FIG. 3, when a line of the amplifier 12 connected to the input terminal IN is cut off and connected to the output of the buffer 20, a clock buffer with the connection relationship shown in FIG. 17A can be realized. Further, in the clock buffer shown in FIG. 11, when lines of the LPF 32a, BPF 32b and HPF 32c connected to the input terminal IN are cut off and connected to the output of the buffer 40, a clock buffer with the connection relationship shown in FIG. 17A can be realized.

Figure 17B:
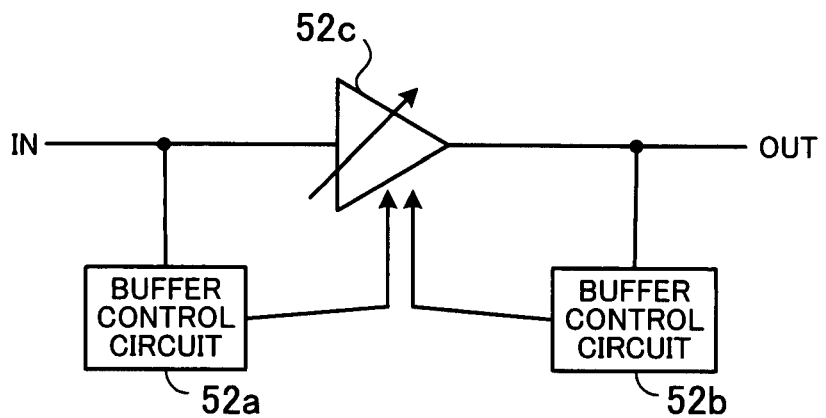

Buffer control circuits 52a and 52b and buffer 52c shown in FIG. 17B have the same constitutions as those of the buffer control circuit 10 and buffer 20 described in the embodiment. Further, the buffer control circuits 52a and 52b and the buffer 52c have the same constitutions as those of the buffer control circuit 30 and buffer 40 described in the embodiment.

The buffer control circuit 52a controls the buffer 52c according to the actual clock input to the input terminal IN. The buffer control circuit 52b controls the buffer 52c according to the actual clock output from the buffer 52c. Specifically, in FIG. 17B, the buffer control circuit 52a controls the buffer 52c to waveform-shape the actual clock input to the input terminal IN, and at the same time, the buffer control circuit 52b controls the buffer 52c to remove noise included in the actual clock and to output the resulting actual clock. That is, the buffer control circuit 10 and buffer 20 described in the embodiment can waveform-shape the actual clock also based on the connection relationship as shown in FIG. 17B. Further, the buffer control circuit 30 and buffer 40 described in the embodiment also can waveform-shape the actual clock based on the connection relationship as shown in FIG. 17B.

Figure 17C:
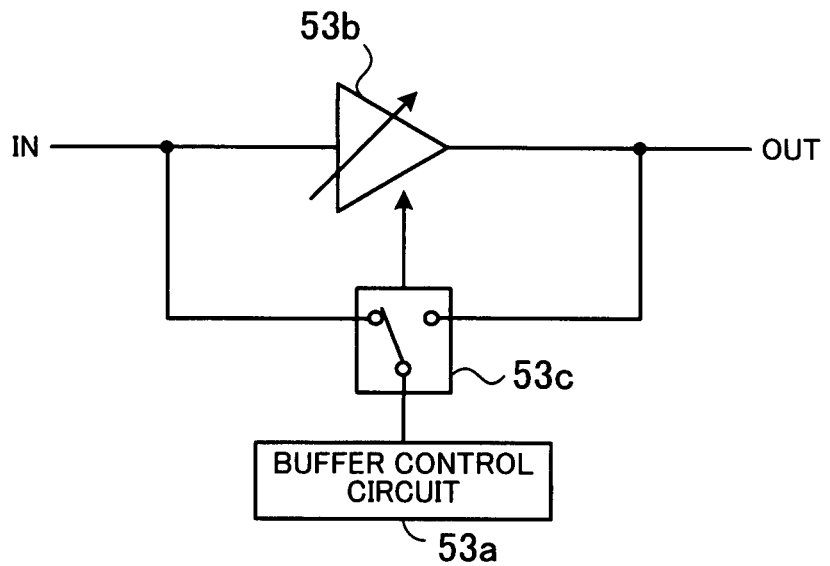

A buffer control circuit 53a and buffer 53b shown in FIG. 17C have the same constitutions as those of the buffer control circuit 10 and buffer 20 described in the embodiment. Further, the buffer control circuit 53a and the buffer 53b have the same constitutions as those of the buffer control circuit 30 and buffer 40 described in the embodiment.

The switch 53c switches the buffer control circuit 53a either to control the buffer 53b according to the actual clock input to the input terminal IN or to control the buffer 53b according to the actual clock output from the buffer 53b.

When the switch 53c switches the buffer control circuit 53a to control the buffer 53b according to the actual clock input to the input terminal IN, the clock buffer shown in FIG. 17C corresponds to the clock buffers described in aforementioned embodiments. Meanwhile, when the switch 53c switches the buffer control circuit 53a to control the buffer 53b according to the actual clock output from the buffer 53b, the clock buffer shown in FIG. 17C corresponds to the clock buffer shown in FIG. 17A. In short, the buffer control circuit 10 and buffer 20 described in the embodiment can waveform-shape the actual clock by switching the connection relationship using the switch 53c shown in FIG. 17C. The buffer control circuit 30 and buffer 40 described in the embodiment also can waveform-shape the actual clock by switching the connection relationship using the switch 53c shown in FIG. 17C.

Next, simulations of offset voltage effects and noise effects using the low-pass clock buffer and the bandpass clock buffer will be described.

Figure 18A:
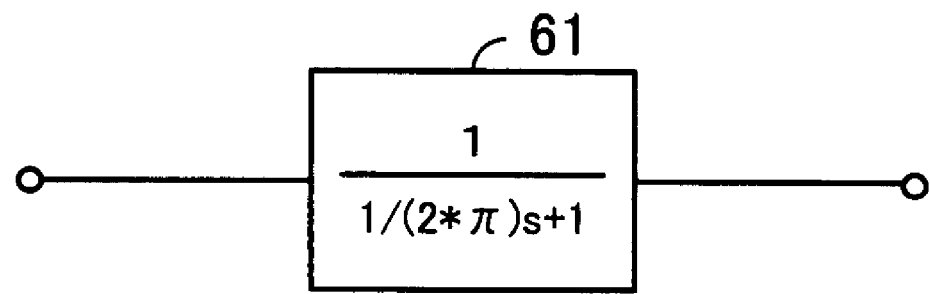
FIGS. 18A and 18B show models of a clock buffer for simulating offset voltage effects and noise effects.
Figure 26:
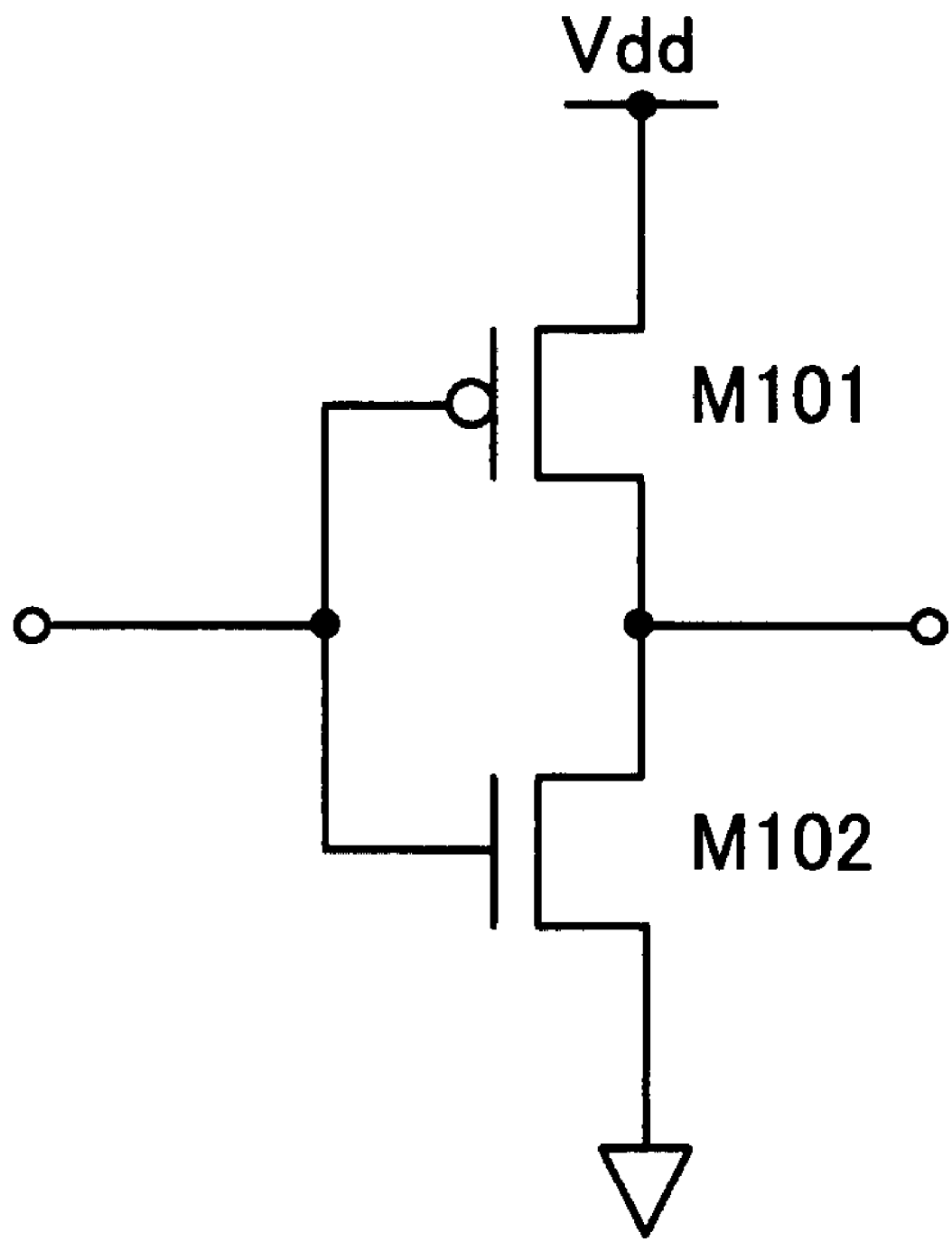
FIG. 26 is a block diagram of an unbalanced clock buffer using an inverter.
Figure 27:
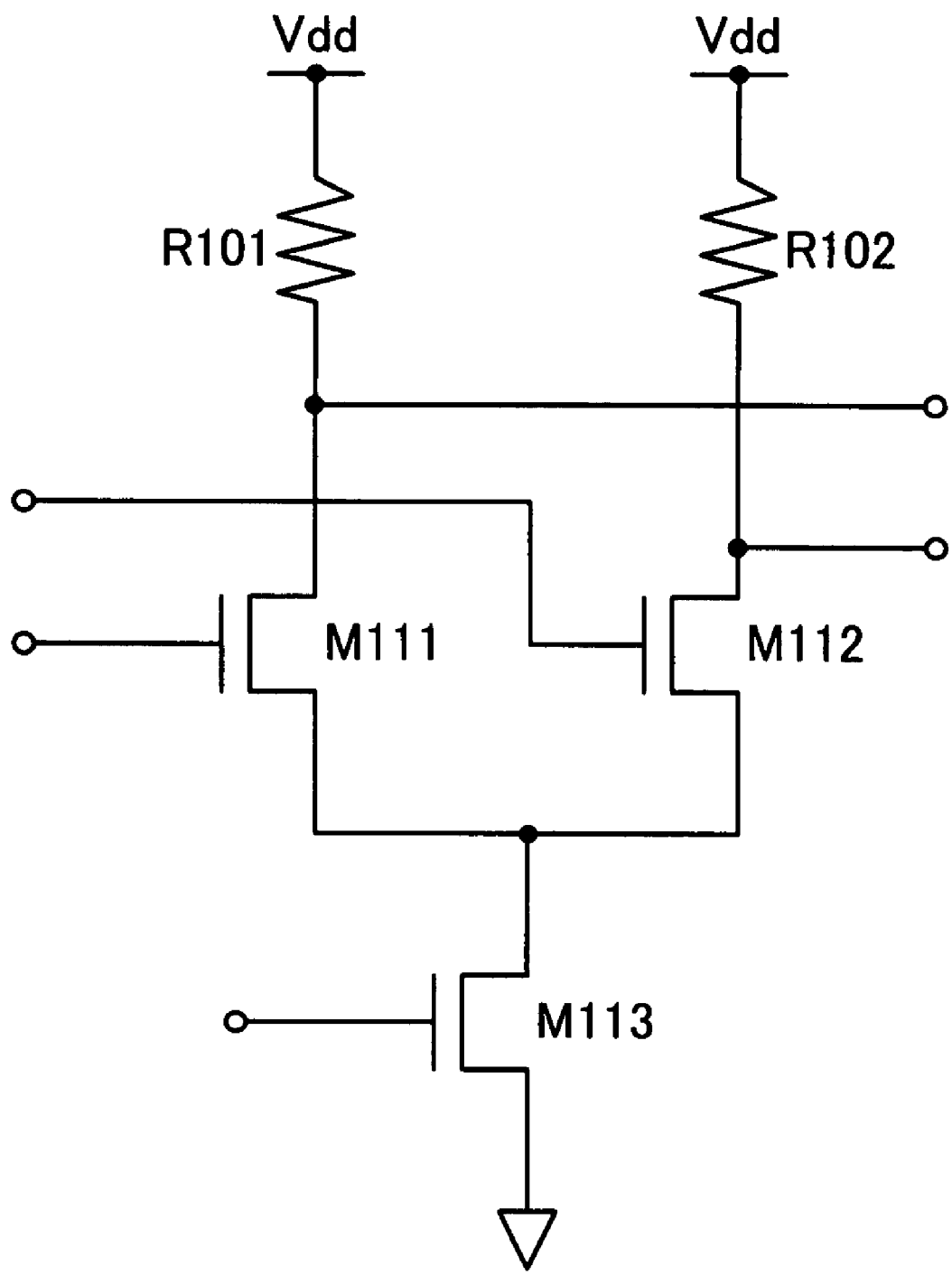
FIG. 27 is a block diagram of a balanced clock buffer based on differential CML.
Figure 28:
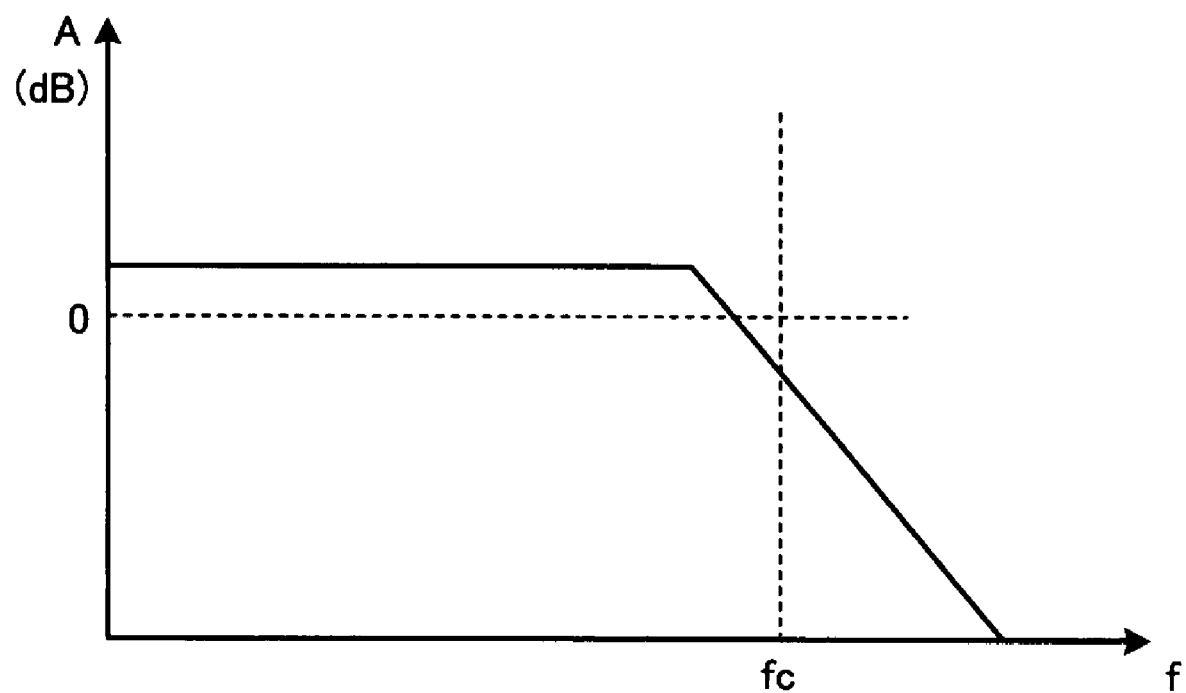
FIG. 28 shows frequency characteristics of a conventional clock buffer.

FIG. 18 shows a model of the clock buffer for simulating offset voltage effects and noise effects. A clock buffer 61 shown in FIG. 18A has the same low-pass frequency characteristic as those of the clock buffers described in FIGS. 26 and 27, and has a transfer function as shown in FIG. 18A.

Figure 18B:
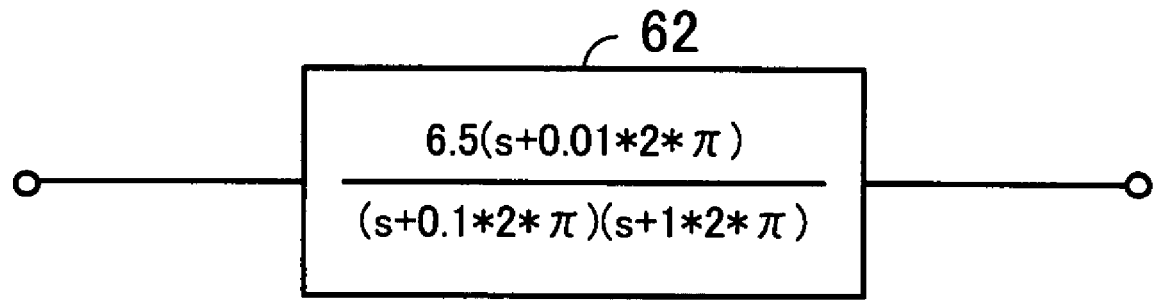

A clock buffer 62 shown in FIG. 18B has the same bandpass frequency characteristic as those of the clock buffers described in the aforementioned embodiments, and has a transfer function as shown in FIG. 18B.

Figure 19:
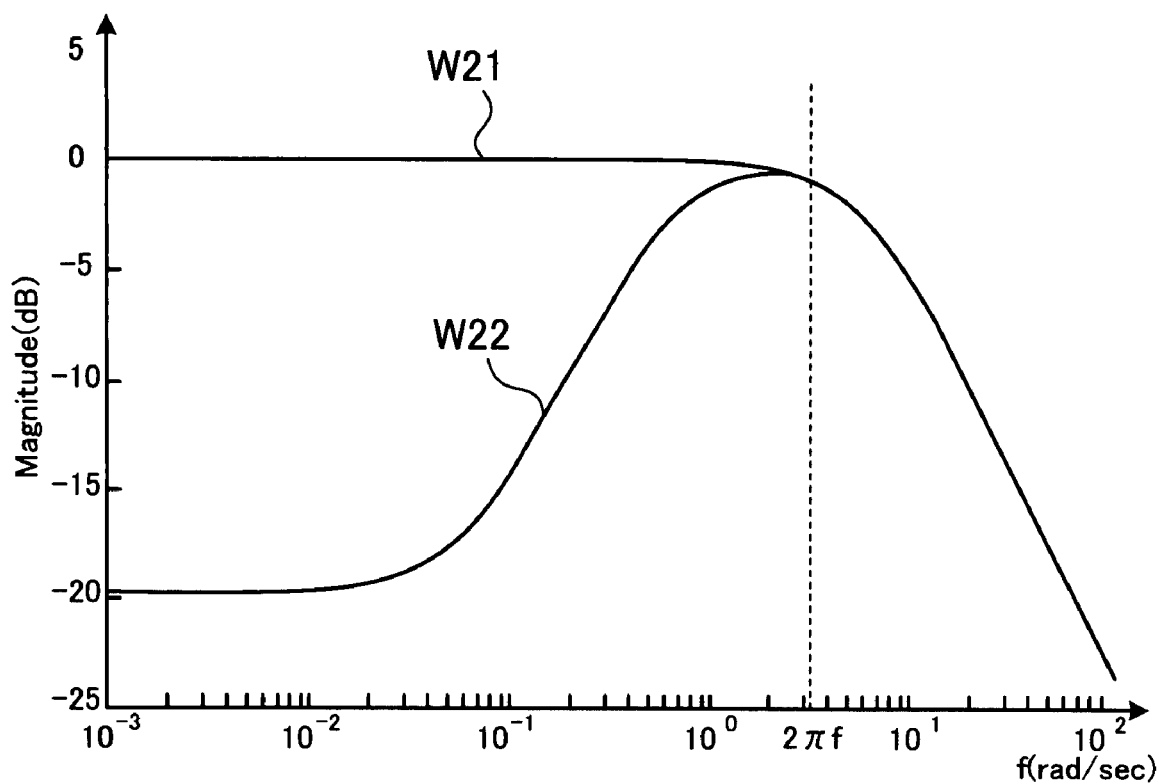
FIG. 19 shows frequency characteristics of the clock buffer in FIG. 18.

FIG. 19 shows frequency characteristics of the clock buffers in FIG. 18. A waveform W21 shown in FIG. 19 shows frequency characteristics of the clock buffer 61 in FIG. 18. That is, the transfer function shown in the clock buffer 61 in FIG. 18 shows a low-pass frequency characteristic as shown by the waveform W21. A waveform W22 shown in FIG. 19 shows the frequency characteristics of the clock buffer 62 in FIG. 18. That is, the transfer function shown in the clock buffer 62 in FIG. 18 shows a band pass-frequency characteristic as shown by the waveform W22.

Next, output simulations using the clock buffers 61 connected in multiple stages will be described in the case where an offset voltage is added to the actual clock and in the case where no offset voltage is added to the actual clock, that is, in the case where a DC component is superimposed on the actual clock and in the case where no DC component is superimposed on the actual clock.

Figure 20A:
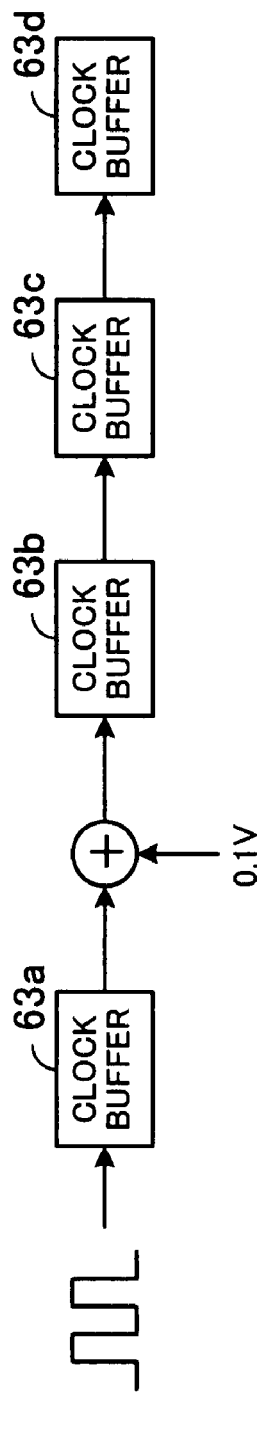
FIGS. 20A and 20B show models of a clock buffer for simulating offset voltage effects.

FIG. 20 shows a model of the clock buffer for simulating offset voltage effects. Clock buffers 63a to 63d shown in FIG. 20A each correspond to the clock buffer 61 shown in FIG. 18. The clock buffers 63b to 63d are clock buffers for simulating the case where an offset voltage (0.1 V) is added to the actual clock (1 V). The actual clock used in the simulation has an ideal square wave. Therefore, the clock buffer 63a makes a waveform of the actual clock dull to approximate it to an actual waveform and inputs the resulting clock to the clock buffer 63b.

Figure 20B:
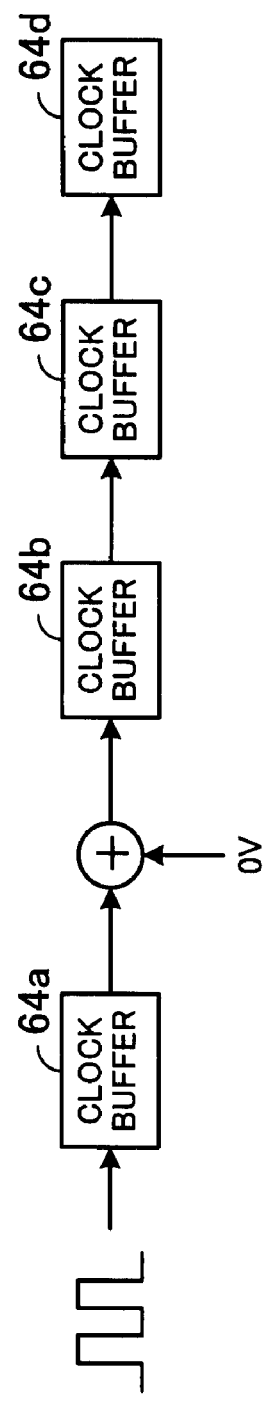

Clock buffers 64a to 64d shown in FIG. 20B each correspond to the clock buffer 61 shown in FIG. 18. The clock buffers 64b to 64d are clock buffers for simulating the case where no offset voltage is added to the actual clock. The actual clock used in the simulation has an ideal square wave. Therefore, the clock buffer 64a makes a waveform of the actual clock dull to approximate it to an actual waveform and inputs the resulting clock to the clock buffer 64b.

Each of the clock buffers 63b to 63d corresponds to the clock buffer 61 and therefore, has a low-pass frequency characteristic shown by the waveform W21 in FIG. 19. Accordingly, the offset voltage of 0.1 V passes through the clock buffers 63b to 63d.

Figure 21:
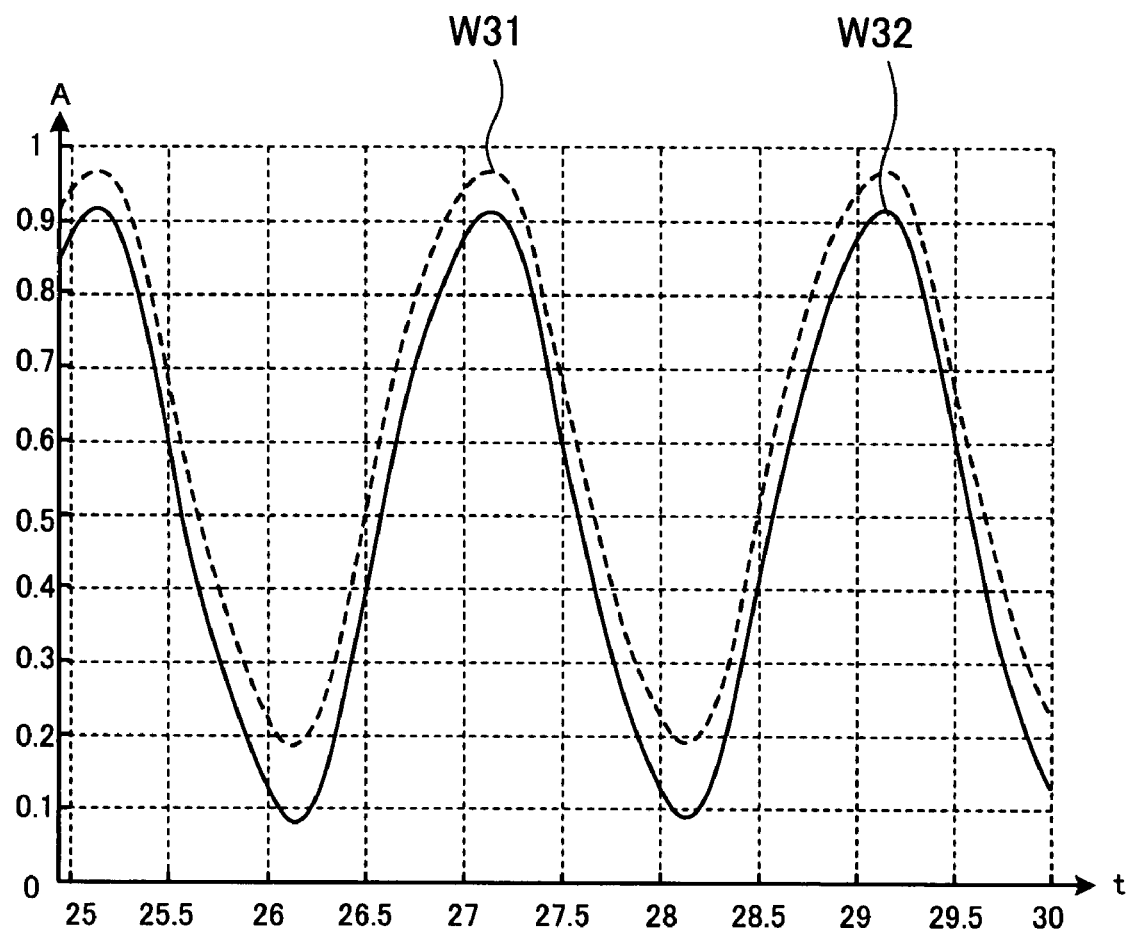
FIG. 21 shows simulation results in the case where an offset voltage is added to an actual clock.

FIG. 21 shows simulation results in the case where the offset voltage is added to the actual clock. A waveform W31 shown in FIG. 21 shows an output waveform of the clock buffer 63d shown in FIG. 20, and a waveform W32 shows an output waveform of the clock buffer 64d shown in FIG. 20. Since the offset voltage of 0.1 V added to the actual clock passes through the low-pass clock buffers 63b to 63d, the actual clock has a waveform influenced by the offset voltage as shown by the waveform W31, as contrasted with the waveform W32 in the case where no offset voltage is added to the actual clock.

The clock buffer generally has a gain for amplifying the actual clock attenuated by a clock line. Therefore, whenever the actual clock passes through the clock buffers, the offset voltage is amplified so that the clock waveform may collapse.

Next, description will be made on the case where instead of the offset voltage, noise is added to the actual clock and the resulting clock is input to the clock buffer 63b.

Figure 22:
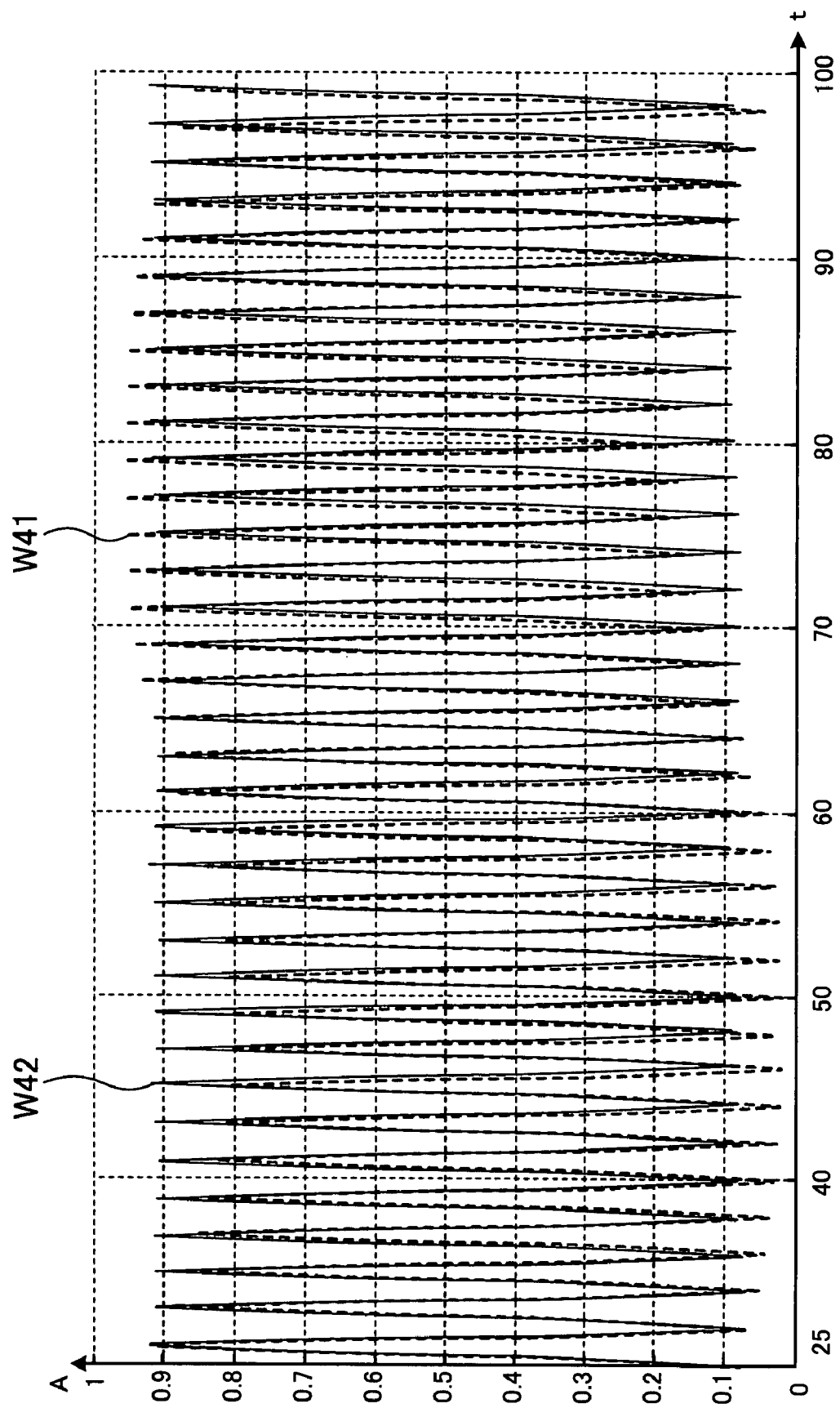
FIG. 22 shows simulation results in the case where sine-wave noise is added to an actual clock.

FIG. 22 shows simulation results in the case where sine-wave noise is added to the actual clock. A waveform W41 in FIG. 22 shows an output waveform of the clock buffer 63d in the case where instead of the offset voltage of 0.1 V, sine-wave noise having an angular frequency of 0.1 rad/sec and an intensity of one tenth of that of the actual clock is added to the actual clock and the resulting clock is input to the clock buffer 63b in FIG. 20A. A waveform W42 shows an output waveform of the clock buffer 64d in FIG. 20B.

Noise in the pass band of the clock buffers 63b to 63d passes through the clock buffers 63b to 63d. Therefore, the actual clock has an undulating waveform as shown by the waveform W41.

The clock buffer generally has a gain for amplifying the actual clock attenuated by a clock line. Therefore, whenever the actual clock passes through the clock buffers, the undulation is amplified so that the clock waveform may collapse.

Next, output simulations using the clock buffers 62 in FIG. 18 connected in multiple stages will be described in the case where an offset voltage is added to the actual clock and in the case where no offset voltage is added to the actual clock, that is, in the case where a DC component is superimposed on the actual clock and in the case where no DC component is superimposed on the actual clock.

Figures 23A, 23B:
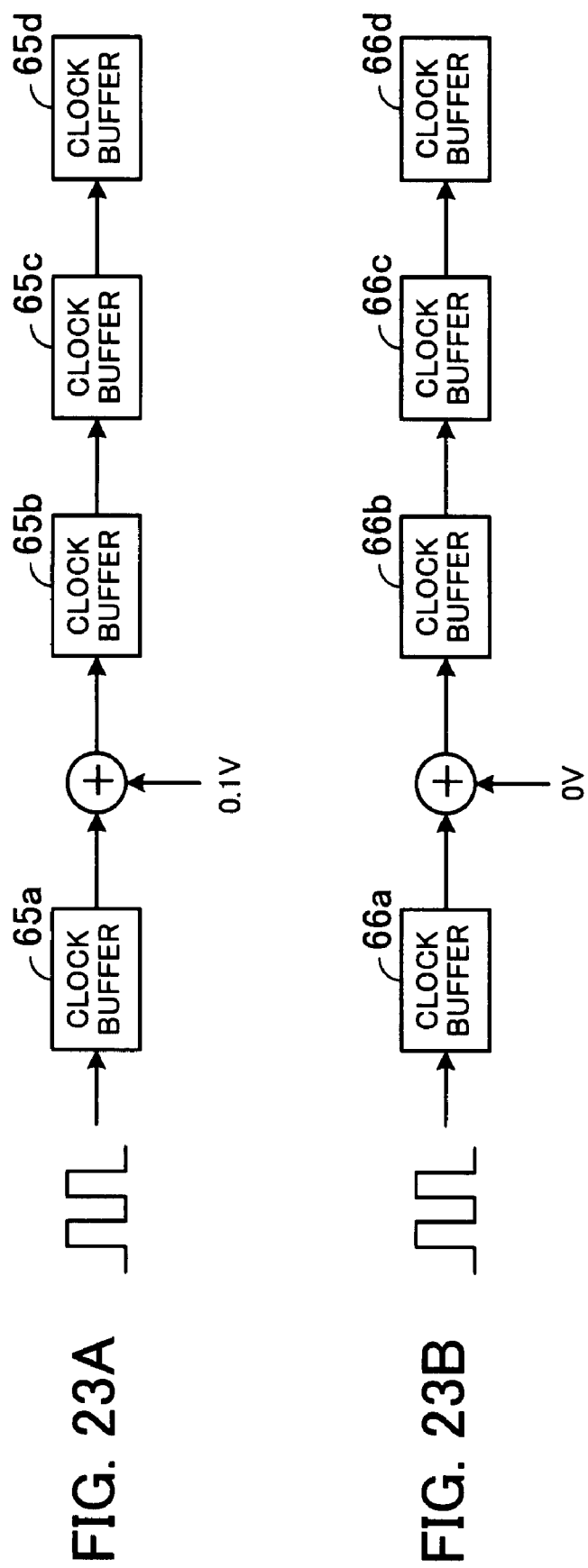
FIGS. 23A and 23B show a model of a clock buffer for simulating offset voltage effects.

FIG. 23 shows a model of the clock buffer for simulating offset voltage effects. A clock buffer 65a shown in FIG. 23A corresponds to the clock buffer 61 shown in FIG. 18. Clock buffers 65b to 65d shown in FIG. 23A each correspond to the clock buffer 62 shown in FIG. 18. The clock buffers 65b to 65d are clock buffers for simulating the case where an offset voltage (0.1 V) is added to the actual clock (1 V). The actual clock used in the simulation has an ideal square wave. Therefore, the clock buffer 65a makes a waveform of the actual clock dull to approximate it to an actual waveform and inputs the resulting clock to the clock buffer 65b.

A clock buffer 66a shown in FIG. 23B corresponds to the clock buffer 61 shown in FIG. 18. Clock buffers 66b to 66d shown in FIG. 23B each correspond to the clock buffer 62 shown in FIG. 18. The clock buffers 66b to 66d are clock buffers for simulating the case where no offset voltage is added to the actual clock. The actual clock used in the simulation has an ideal square wave. Therefore, the clock buffer 66a makes a waveform of the actual clock dull to approximate it to an actual waveform and inputs the resulting clock to the clock buffer 66b.

Each of the clock buffers 65b to 65d corresponds to the clock buffer 62 and therefore, has a band-pass frequency characteristic shown by the waveform W22 in FIG. 19. Accordingly, the offset voltage of 0.1 V does not pass through the clock buffers 65b to 65d.

Figure 24:
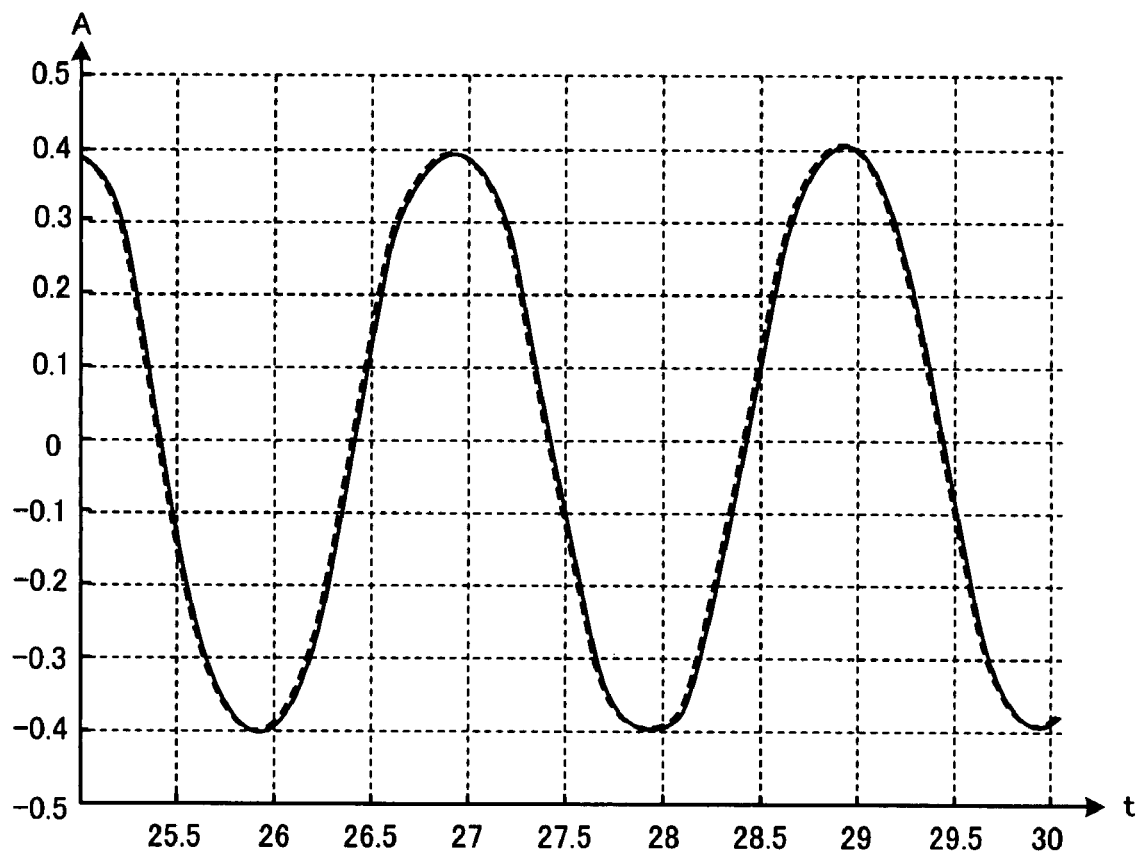
FIG. 24 shows simulation results in the case where an offset voltage is added to an actual clock.

FIG. 24 shows simulation results in the case where the offset voltage is added to the actual clock. FIG. 24 shows output waveforms of the clock buffers 65d and 66d in FIG. 23. In FIG. 24, the solid waveform is an output waveform of the clock buffer 65d and the dashed waveform is an output waveform of the clock buffer 66d.

As shown by the waveform W22 in FIG. 19, the clock buffers 65b to 65d have a sufficiently low gain at low frequencies, and therefore, prevent the offset voltage from passing therethrough. Therefore, as shown in FIG. 24, the output waveform of the clock buffer 65d is not influenced by the offset voltage and is the same waveform as that of the clock buffer 66d in the case where no offset voltage is added to the actual clock.

The clock buffer generally has a gain for amplifying the actual clock attenuated by a clock line. However, each of the clock buffers 65b to 65d has a gain of less than 0 dB at frequencies below the pass band. Therefore, whenever the actual clock passes through the clock buffers 65b to 65d, the offset voltage is attenuated.

Next, description will be made on the case where instead of the offset voltage, noise is added to the actual clock and the resulting clock is input to the clock buffer 65b.

Figure 25:
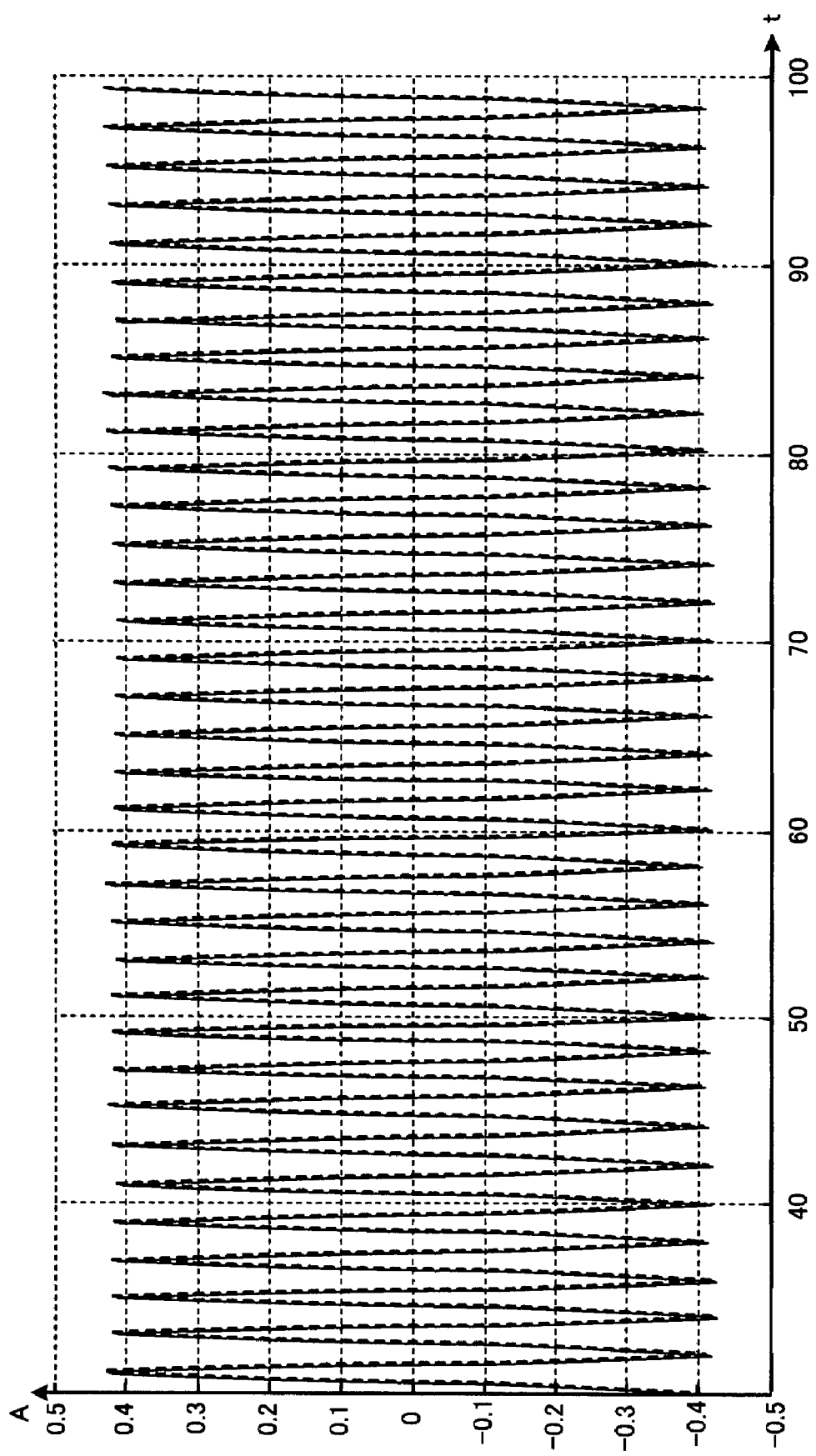
FIG. 25 shows simulation results in the case where sine-wave noise is added to an actual clock.

FIG. 25 shows simulation results in the case where sine-wave noise is added to the actual clock. FIG. 25 shows an output waveform of the clock buffer 65d in the case where instead of the offset voltage of 0.1 V, sine-wave noise having an angular frequency of 0.1 rad/sec and an intensity of one tenth of that of the actual clock is added to the actual clock and the resulting clock is input to the clock buffer 65b in FIG. 23A. In FIG. 25, the solid waveform is an output waveform of the clock buffer 65d and the dashed waveform is an output waveform of the clock buffer 66d.

Noise at frequencies below the pass bands of the clock buffers 65b to 65d is blocked by the clock buffers 65b to 65d. Therefore, the output waveform of the clock buffer 65d is the same output waveform as that of the clock buffer 66d in the case where no noise is added to the actual clock.

The clock buffer generally has a gain for amplifying the actual clock attenuated by a clock line. However, each of the clock buffers 65b to 65d has a gain of less than 0 dB at frequencies below the pass band. Therefore, whenever the actual clock passes through the clock buffers 65b to 65d, noise at frequencies below the pass band is attenuated.

Thus, the clock buffer is designed to have a band-pass frequency characteristic, in which a pass band of the clock buffer includes the fundamental frequency of the actual clock and a gain of less than 0 dB is provided at frequencies below the pass band. As a result, noise at frequencies below the fundamental frequency of the actual clock is reduced, so that jitter can be reduced. Further, a DC component included in the actual clock is suppressed, so that disappearance of the actual clock can be prevented.

The foregoing is considered as illustrative only of the principles of the embodiments. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock buffer for waveform-shaping a clock, comprising:
   a buffer which, when the clock is input, changes the frequency characteristics;
   an ideal clock output circuit which outputs an ideal clock having an ideal waveform of the clock;
   a waveform detection circuit which detects a difference between a waveform of the clock and a waveform of the ideal clock; and
   a frequency characteristic change circuit which changes the frequency characteristics of the buffer according to the difference.

2. The clock buffer according to claim 1, wherein
   a band-pass frequency characteristic of the clock buffer includes a pass band which includes a fundamental frequency of the clock and a gain for attenuating signals at frequencies below the pass band.

3. The clock buffer according to claim 1, wherein the ideal clock output circuit adjusts a frequency and a phase of the ideal clock to a frequency and a phase of the clock and outputs the ideal clock.

4. The clock buffer according to claim 3, wherein the ideal clock output circuit adjusts the frequencies first.

5. The clock buffer according to claim 1, wherein:
   when the frequency of the clock is a fixed frequency, the ideal clock output circuit generates the ideal clock at the fixed frequency and adjusts the phase of the ideal clock to the phase of the clock and outputs the ideal clock.

6. The clock buffer according to claim 1, wherein the buffer comprises:
   a flat-band amplifier which receives the clock;
   a differentiator which received the clock;
   a first variable gain amplifier which amplifies an output of the flat-band amplifier based on an output of the frequency characteristic change circuit;
   a second variable gain amplifier which amplifies an output of the differentiator based on the output of the frequency characteristic change circuit; and
   a mixer which adds outputs of the first variable gain amplifier and the second variable gain amplifier.

7. A clock buffer for waveform-shaping a clock, comprising:
   a buffer which, when the clock is input, changes the frequency characteristics;
   a spectrum detection circuit which detects a spectrum of the clock; and
   a frequency characteristic change circuit which changes the frequency characteristics of the buffer according to the spectrum.

8. The clock buffer according to claim 7, wherein:
   the spectrum detection circuit detects the fundamental frequency of the clock; and
   the frequency characteristic change circuit changes the frequency characteristics of the buffer such that the pass band includes the fundamental frequency.

9. The clock buffer according to claim 7, wherein:
   the spectrum detection circuit sweeps a pass band of a band pass filter to acquire frequency components of the clock, and detects a frequency having a maximum amplitude among the acquired frequency components as the fundamental frequency.

10. The clock buffer according to claim 7, wherein
    when the frequency of the clock is a fixed frequency, the spectrum detection circuit detects the spectrum at frequencies below or above the pass band including the fixed frequency.

11. The clock buffer according to claim 7, wherein
    a band-pass frequency characteristic of the clock buffer includes a pass band which includes a fundamental frequency of the clock and a gain for attenuating signals at frequencies below the pass band.

12. A clock buffer for waveform-shaping a clock, Comprising:
    a buffer which, when the clock is input, changes the frequency characteristics;
    a buffer control circuit which changes the frequency characteristics of the buffer; and
    a switching circuit which switches the buffer control circuit either to control the buffer according to the clock inputted to the buffer or to control the buffer according to the clock outputted from the buffer.

13. The clock buffer according to claim 12, wherein
    a band-pass frequency characteristic of the clock buffer includes a pass band which includes a fundamental frequency of the clock and a gain for attenuating signals at frequencies below the pass band.

* * * * *